(12) United States Patent
Nakamura et al.

(10) Patent No.: US 11,215,774 B2
(45) Date of Patent: Jan. 4, 2022

(54) SEMICONDUCTOR OPTICAL INTEGRATED DEVICE

(71) Applicant: Mitsubishi Electric Corporation, Tokyo (JP)

(72) Inventors: Naoki Nakamura, Tokyo (JP); Eitaro Ishimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 10 days.

(21) Appl. No.: 16/959,356

(22) PCT Filed: Feb. 19, 2018

(86) PCT No.: PCT/JP2018/005636
§ 371 (c)(1),
(2) Date: Jun. 30, 2020

(87) PCT Pub. No.: WO2019/159345
PCT Pub. Date: Aug. 22, 2019

(65) Prior Publication Data
US 2021/0063659 A1 Mar. 4, 2021

(51) Int. Cl.
*G02B 6/42* (2006.01)
*H01L 31/0232* (2014.01)
*H01L 31/101* (2006.01)

(52) U.S. Cl.
CPC ...... *G02B 6/4286* (2013.01); *H01L 31/02327* (2013.01); *H01L 31/101* (2013.01)

(58) Field of Classification Search
None
See application file for complete search history.

(56) References Cited

U.S. PATENT DOCUMENTS 10,698,159 B2 * 6/2020 Bian ................. G02B 6/122
10,811,549 B2 * 10/2020 Kurczveil .......... G02B 6/12004
(Continued)

FOREIGN PATENT DOCUMENTS

JP  2000-114642 A   4/2000
JP  2009-014681 A   1/2009
(Continued)

OTHER PUBLICATIONS

International Search Report issued in PCT/JP2018/005636; dated May 22, 2018.
(Continued)

*Primary Examiner* — Tina M Wong
(74) *Attorney, Agent, or Firm* — Studebaker & Brackett PC

(57) ABSTRACT

A semiconductor optical integrated device is a semiconductor optical integrated device in which a first optical element, a monitoring light waveguide and a second optical element, through which light propagates, are formed on a common semiconductor substrate; wherein the monitoring light waveguide is joined to the first optical element, and the second optical element is joined to the monitoring light waveguide. The monitoring light waveguide includes a light scattering portion for scattering a part of the light, which is composed of a combination of light waveguides having different mode field diameters or having different centers of mode field diameters; and a light detector for receiving scattered light scattered by the light scattering portion, is placed on an outer periphery of the monitoring light waveguide, or on a back surface of the semiconductor substrate on its side opposite to that facing the light scattering portion.

20 Claims, 19 Drawing Sheets

(56) References Cited

U.S. PATENT DOCUMENTS

| 2011/0243494 | A1 | 10/2011 | Hasegawa et al. |
| 2013/0301985 | A1 | 11/2013 | Achouche et al. |
| 2015/0085889 | A1 | 3/2015 | Eichler et al. |
| 2016/0099547 | A1 | 4/2016 | Eichler et al. |
| 2021/0063659 | A1* | 3/2021 | Nakamura .............. H01S 5/026 |

FOREIGN PATENT DOCUMENTS

| JP | 2011-165712 A | 8/2011 |
| JP | 2013-540351 A | 10/2013 |
| JP | 2015-518280 A | 6/2015 |

OTHER PUBLICATIONS

Kenji Kawano; "Foundation and Application of Optical Coupling System for Optical Device"; 2nd Edition Date: Jul. 25, 2003; Original Publication: Jan. 25, 1991; pp. 29-36; Japan.

\* cited by examiner

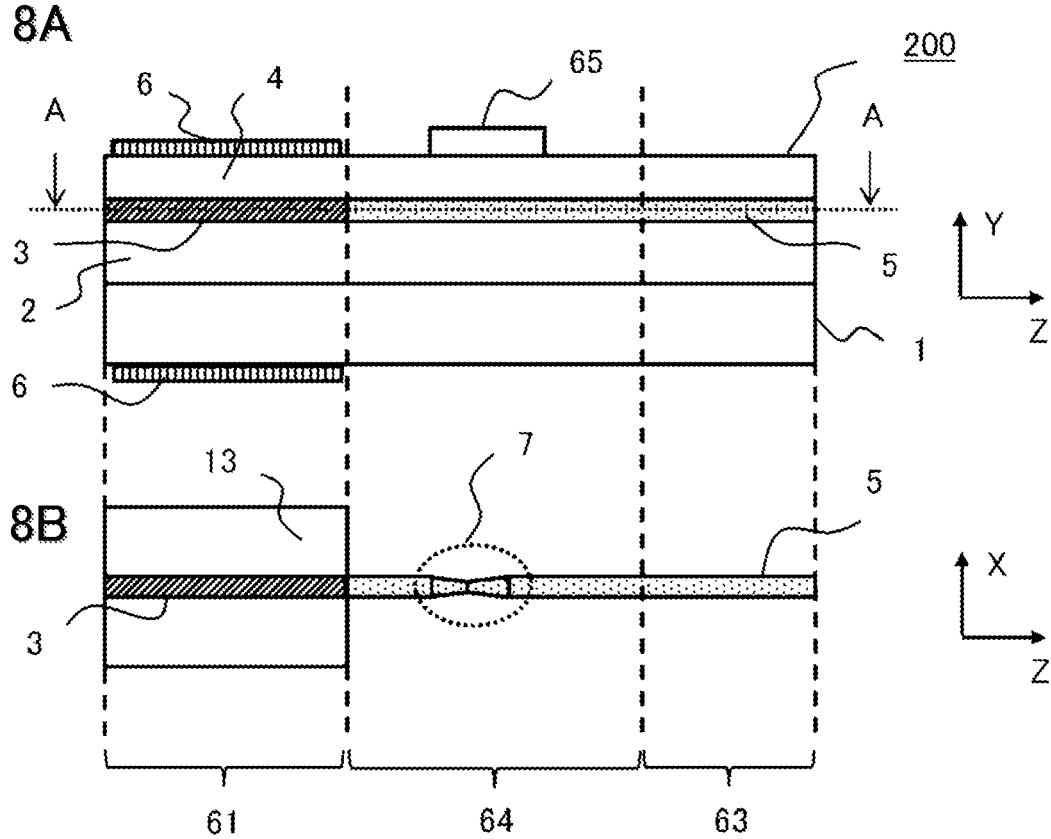
FIG. 8A
FIG. 8B
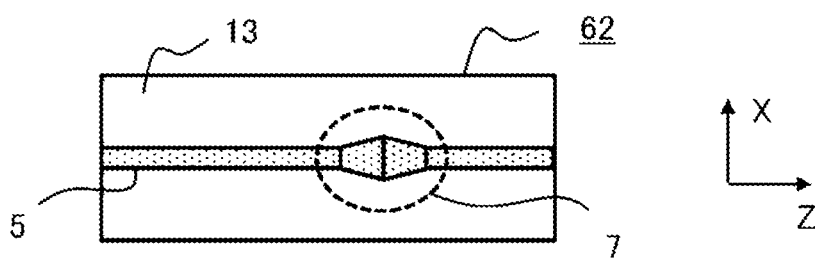
FIG. 9
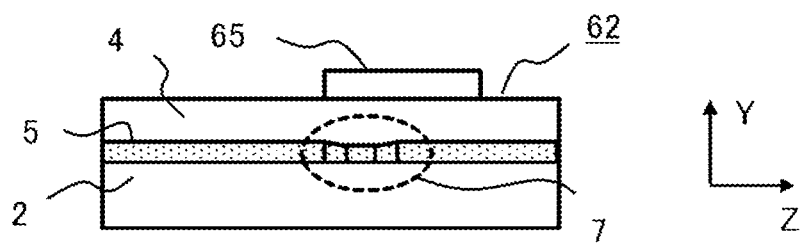
FIG. 10

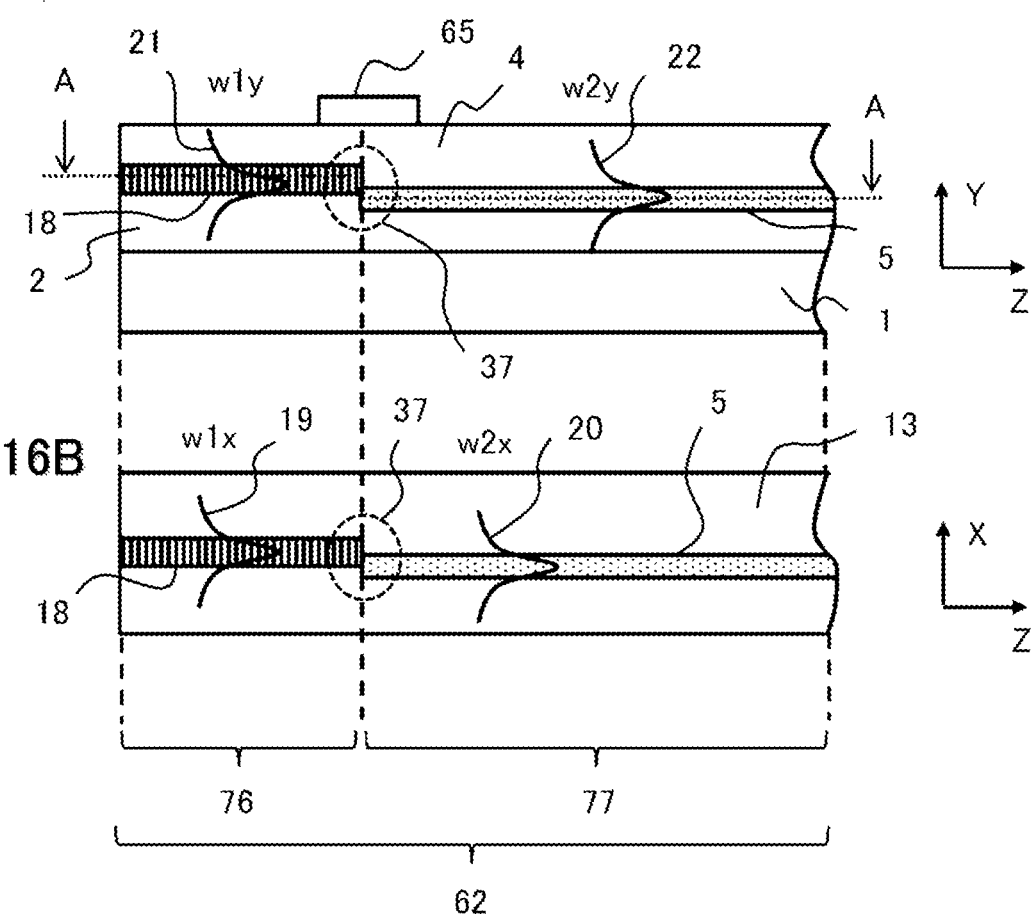

FIG. 17A
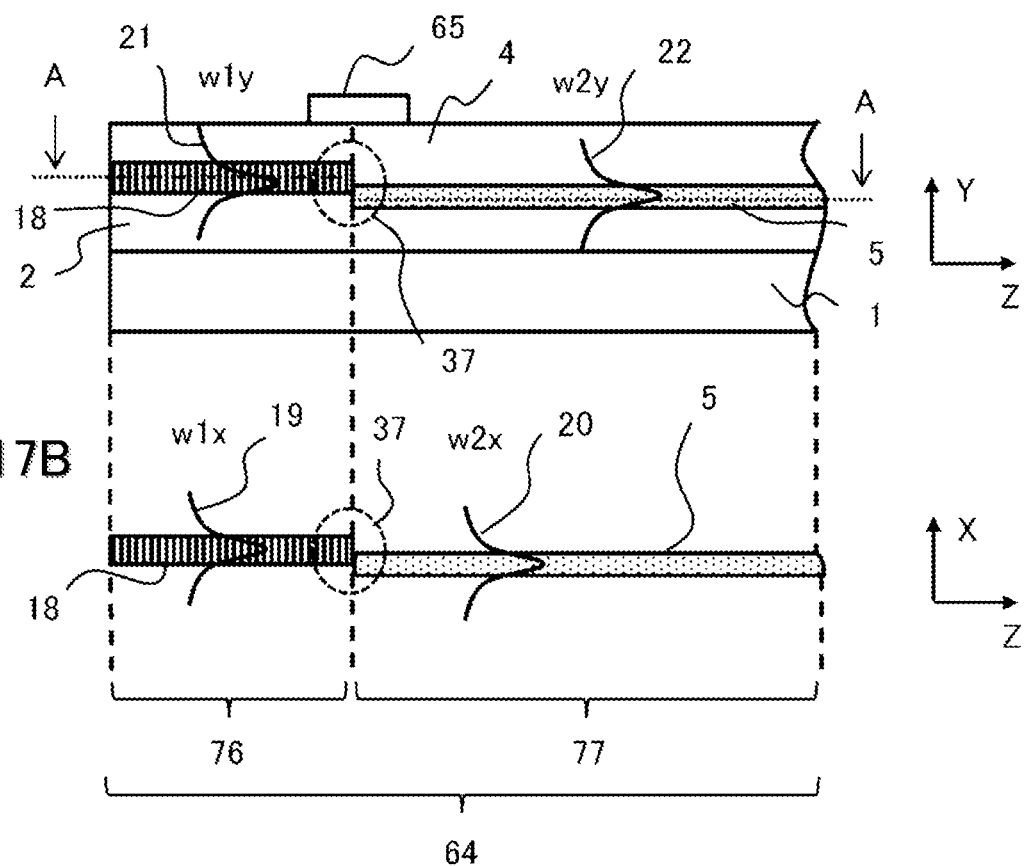
FIG. 17B
FIG. 18
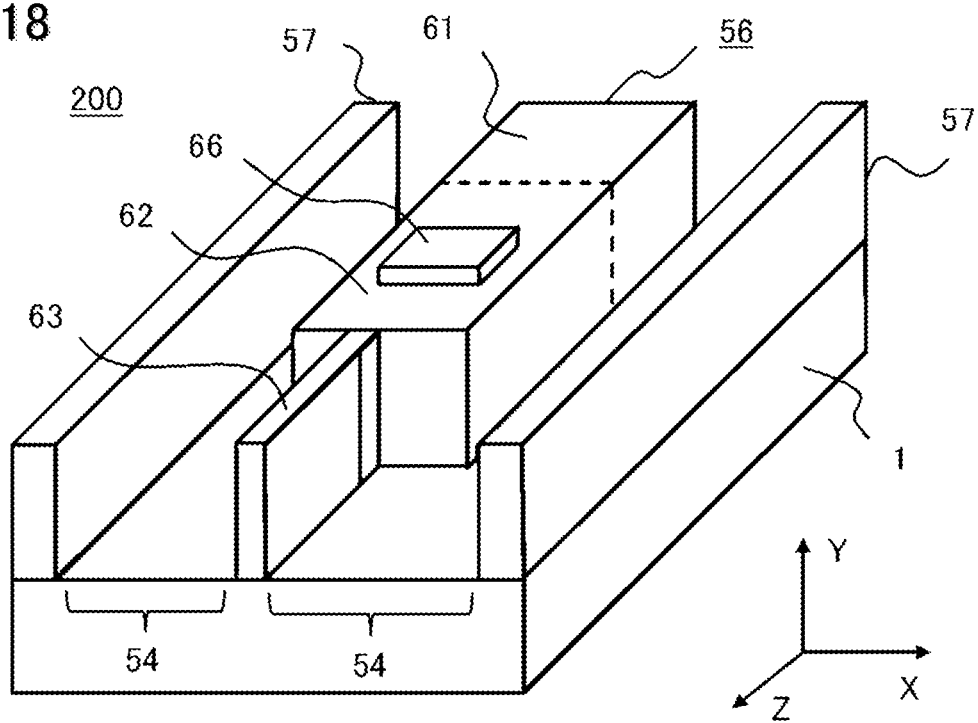

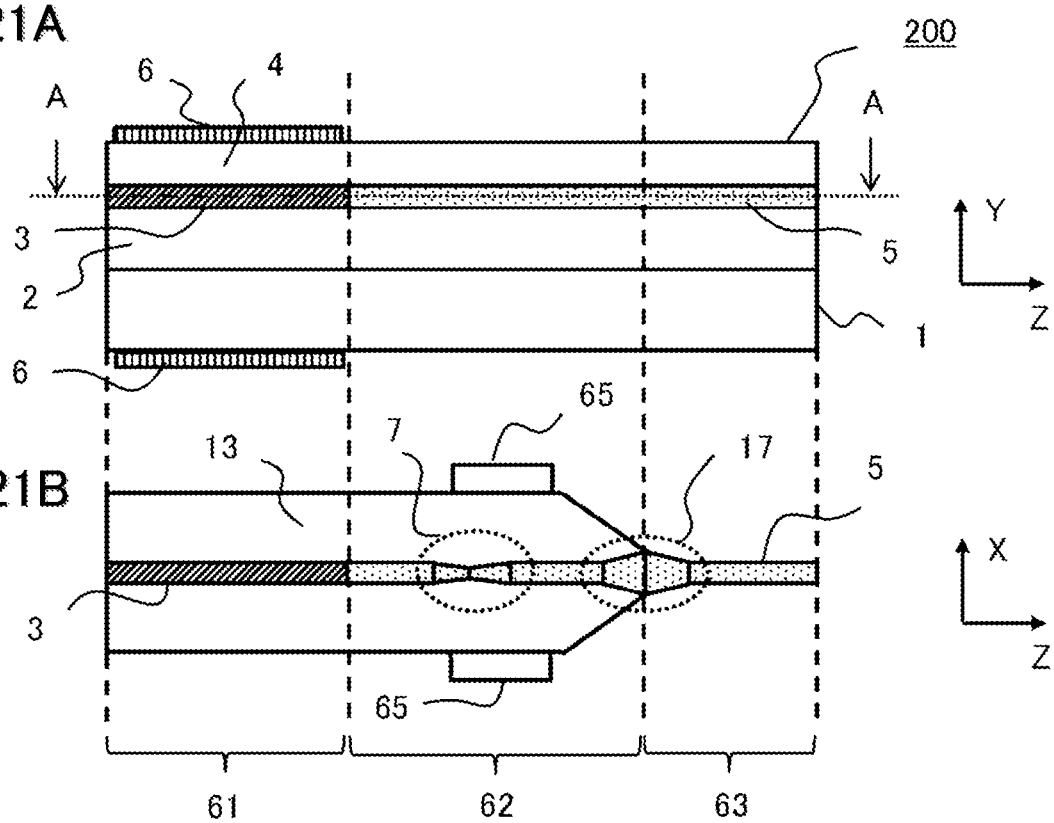
FIG. 21A
FIG. 21B
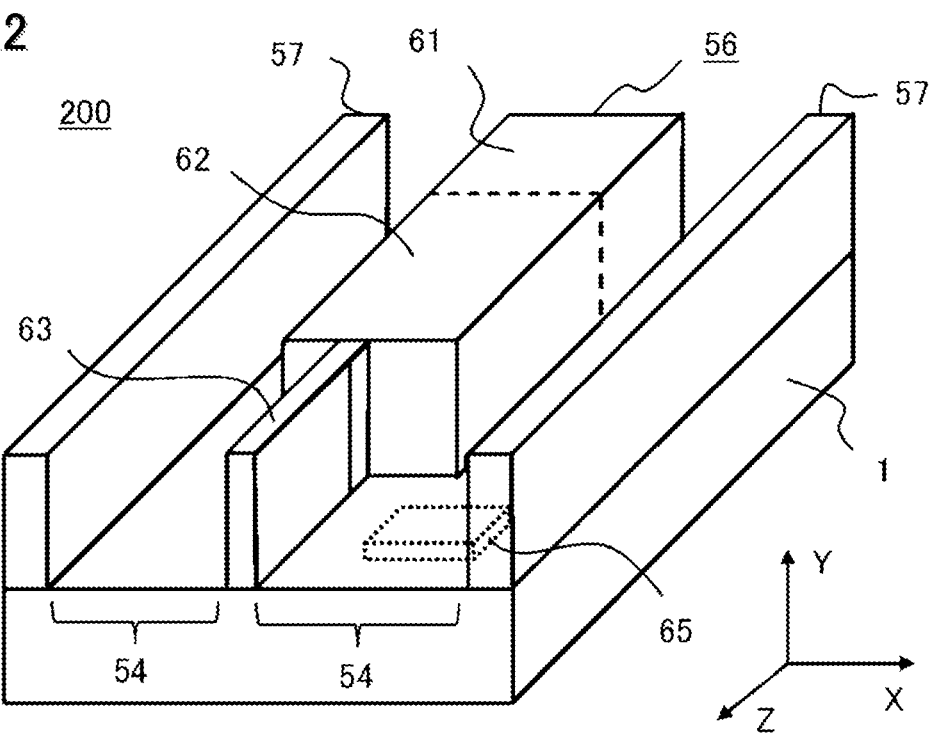
FIG. 22

FIG. 23A
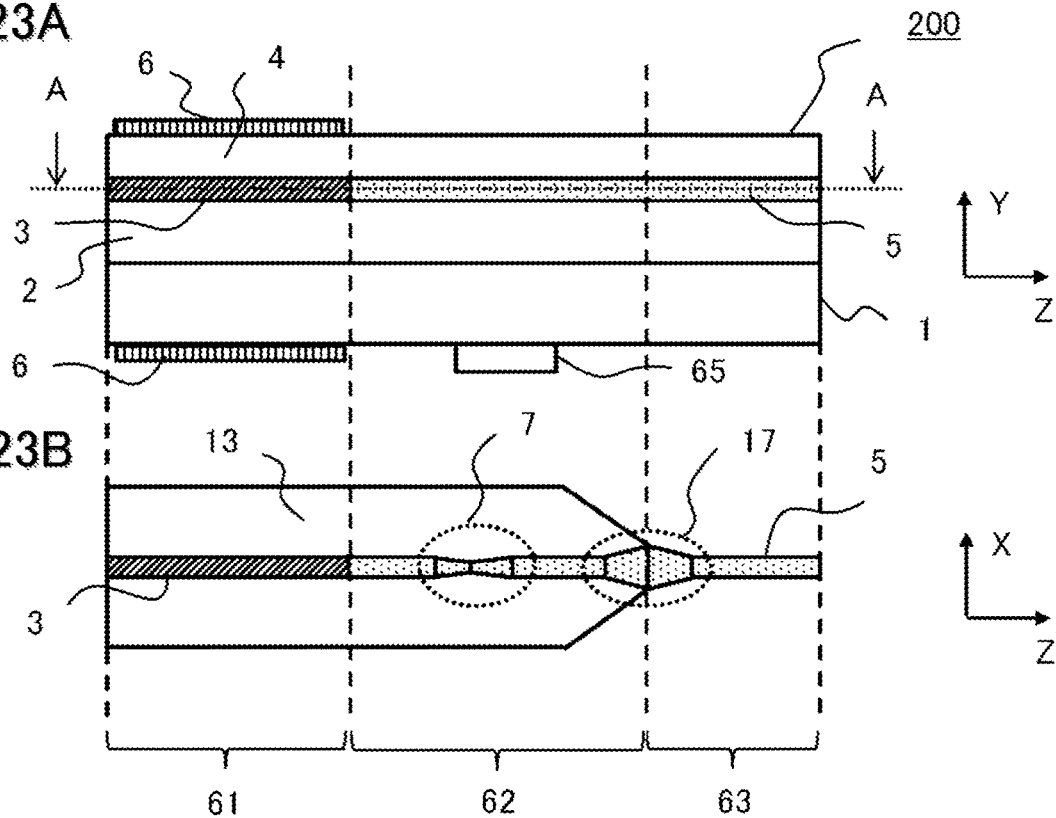
FIG. 23B
FIG. 24A
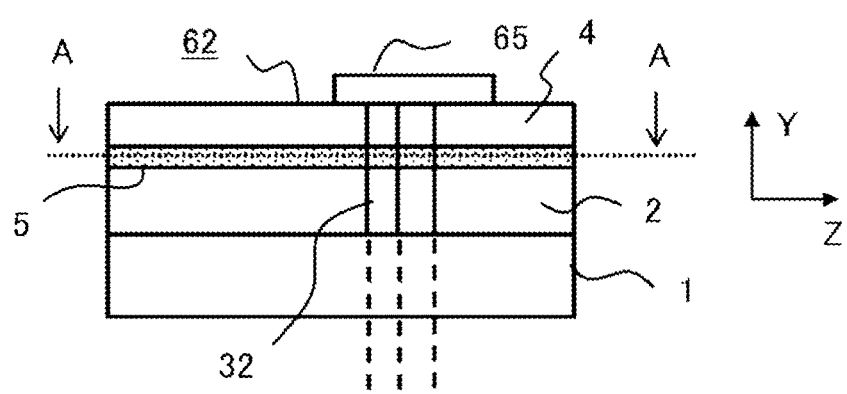
FIG. 24B

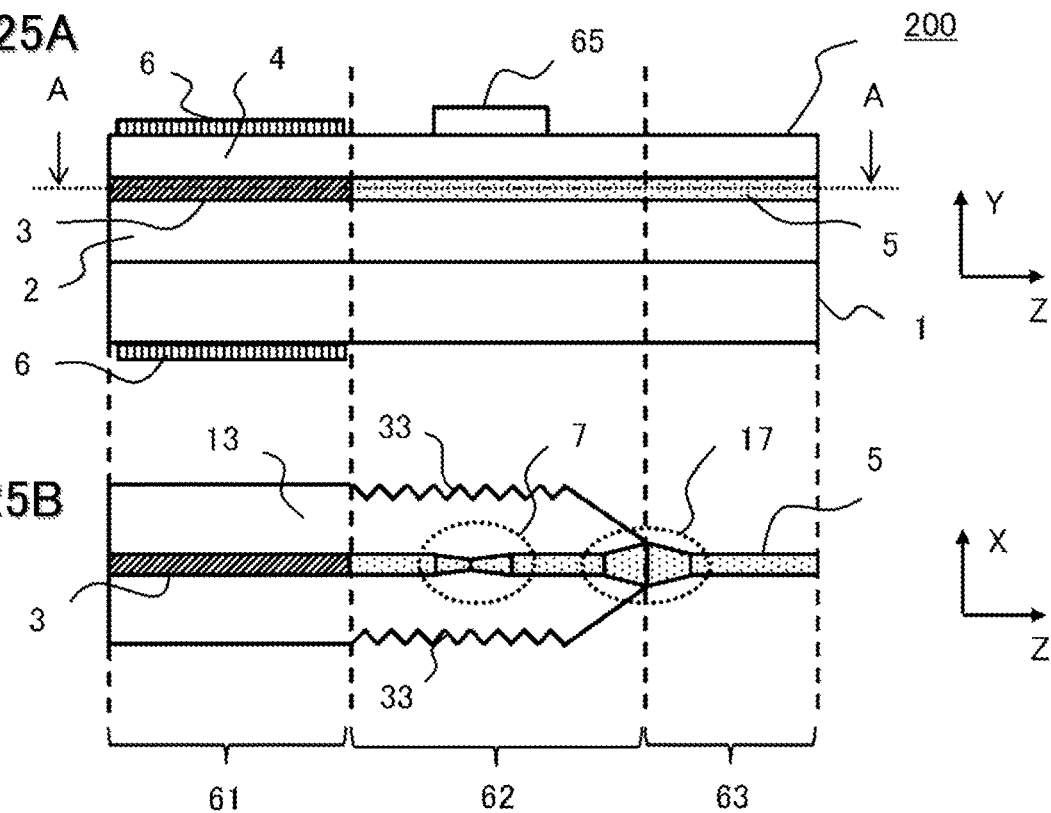
FIG. 25A
FIG. 25B
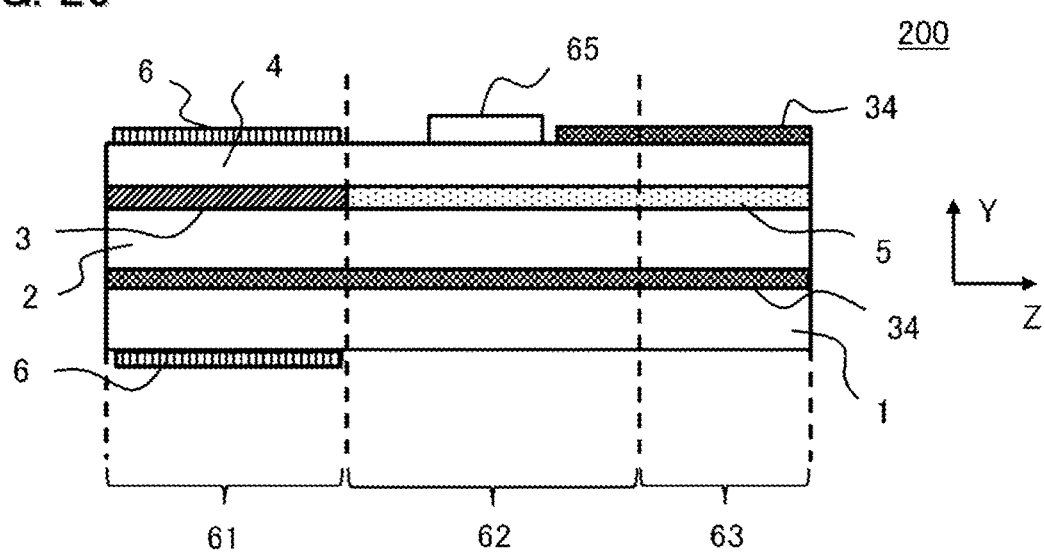
FIG. 26

SEMICONDUCTOR OPTICAL INTEGRATED DEVICE

TECHNICAL FIELD

The present application relates to a semiconductor optical integrated device having a photodiode (PD) for monitoring an intensity of light propagating through a light waveguide.

BACKGROUND ART

Heretofore, there has been a method in which a photodiode for monitoring an intensity of light propagating through a light waveguide (hereinafter, referred to as a monitor PD) is placed on the upper side of the light waveguide, to thereby cause the monitor PD to receive an evanescent light component in the light propagating through the light waveguide (Patent Document 1). As a method of receiving using a monitor PD a part of light propagating through a light waveguide, there has also been a light receiving method that employs a diffraction grating (Patent Document 2). In Patent Document 2, the diffraction grating of the second order of diffraction is placed in a light waveguide portion beneath the monitor PD placed on that light waveguide. The second-order diffraction grating produces diffracted light in a light traveling direction of a light waveguide layer and in a direction perpendicular to that layer. The diffracted light in the perpendicular direction is incident on the monitor PD, so that the monitor PD receives that diffracted light.

CITATION LIST

Patent Document

Patent Document 1: Japanese National Publication of International Patent Application No.2013-540351 (FIG. 2)
Patent Document 2: Japanese Patent Application Laid-open No.2000-114642 (FIG. 1)

SUMMARY OF THE INVENTION

Problems to be Solved by the Invention

According to the light receiving method of Patent Document 1, namely, according to the method of causing the monitor PD to receive an evanescent light component in the light propagating through the light waveguide, there is a problem that, when a layer thickness of an upper cladding layer in the light waveguide layer varies, the evanescent light component caught in the monitor PD increases or decreases, so that the value of a monitoring current generated by the monitor PD varies. In addition, since the light-receiving portion of the monitor PD is a member having a large absorption coefficient and thus has a large refractive index as well, an equivalent refractive index of the guided light varies largely. Thus, due to the light receiving portion of the monitor PD, the distribution of the guided light propagating through the light waveguide is likely to be fluctuated. Accordingly, it is concerned that a far-field pattern of the outgoing light is fluctuated, and that a loss other than an absorption loss due to the monitor PD increases. This makes it difficult to employ the method in Patent Document 1 to form in the semiconductor optical integrated device, a structure in which the monitor PD is placed at the middle of the light waveguide.

According to the method in Patent Document 2 of receiving light propagating through the light waveguide by using the monitor PD, since a part of the light is reflected back along its incoming direction by a portion of the diffraction grating, there is a problem that the characteristics of an optical element attached on the light incident side will be deteriorated. For example, when the optical element is a semiconductor laser, there is a problem that its laser characteristics will be deteriorated because of, for example, noise superimposed on the laser light, due to return light caused by the diffraction grating.

A technique disclosed in the present description has been made to solve the problems as described above, and an object thereof is to provide a semiconductor optical integrated device which can monitor an intensity of light propagating through a light waveguide, without affecting the light distribution of that light and without deteriorating characteristics of an optical element on the light incident side.

Means for Solving the Problems

A semiconductor optical integrated device disclosed as an example in the present description, is a semiconductor optical integrated device in which a first optical element, a monitoring light waveguide and a second optical element, through which light propagates, are formed on a common semiconductor substrate, wherein the monitoring light waveguide is joined to the first optical element, and the second optical element is joined to the monitoring light waveguide. The monitoring light waveguide includes a light scattering portion for scattering a part of the light, which is composed of a combination of light waveguides having different mode field diameters, and a light detector for receiving scattered light scattered by the light scattering portion, is placed on an outer periphery of the monitoring light waveguide, or on a back surface of the semiconductor substrate on its side opposite to that facing the light scattering portion.

Effect of the Invention

According to the semiconductor optical integrated device disclosed as an example in this description, since the light detector for receiving scattered light scattered by the light scattering portion in the monitoring light waveguide for scattering a part of the light, is placed on an outer periphery of the monitoring light waveguide, or on a back surface of the semiconductor substrate on its side opposite to that facing the light scattering portion, it is possible to monitor the intensity of the light propagating through the light waveguide, without affecting the light distribution of the light and without deteriorating characteristics of the optical element on the light incident side.

BRIEF DESCRIPTION OF THE DRAWINGS

FIG. 2.

FIG. 8: FIG. 8A is a sectional view of an optical-element-region mesa in FIG. 7, along the Z-direction; and FIG. 8B is a sectional view on A-A in FIG. 8A.

FIG. 9 is a diagram showing a scattered-light generation pattern according to Embodiment 3.

FIG. 10 is a diagram showing another scattered-light generation pattern according to Embodiment 3.

FIG. 15.

FIG. 16: FIG. 16A is a sectional view of a main part of a monitoring light waveguide according to Embodiment 6, along the Z-direction; and FIG. 16B is a sectional view on A-A in FIG. 16A.

FIG. 17: FIG. 17A is a sectional view of a main part of another monitoring light waveguide according to Embodiment 6, along the Z-direction; and FIG. 17B is a sectional view on A-A in FIG. 17A.

FIG. 18 is a bird's-eye view showing a semiconductor optical integrated device according to Embodiment 7.

FIG. 21: FIG. 21A is a sectional view of an optical-element-region mesa in FIG. 20, along the Z-direction; and FIG. 21B is a sectional view on A-A in FIG. 21A.

FIG. 22 is a bird's-eye view showing a semiconductor optical integrated device according to Embodiment 10.

FIG. 23: FIG. 23A is a sectional view of an optical-element-region mesa in FIG. 22, along the Z-direction; and FIG. 23B is a sectional view on A-A in FIG. 23A.

FIG. 24: FIG. 24A is a sectional view of a main part of a monitoring light waveguide according to Embodiment 11, along the Z-direction; and FIG. 24B is a sectional view on A-A in FIG. 24A.

FIG. 25: FIG. 25A is a sectional view of an optical-element-region mesa in a semiconductor optical integrated device according to Embodiment 12, along the Z-direction; and FIG. 25B is a sectional view on A-A in FIG. 25A.

FIG. 26 is a sectional view of an optical-element-region mesa in a semiconductor optical integrated device according to Embodiment 13, along the Z-direction.

MODES FOR CARRYING OUT THE INVENTION

Embodiment 1

Figure 1:
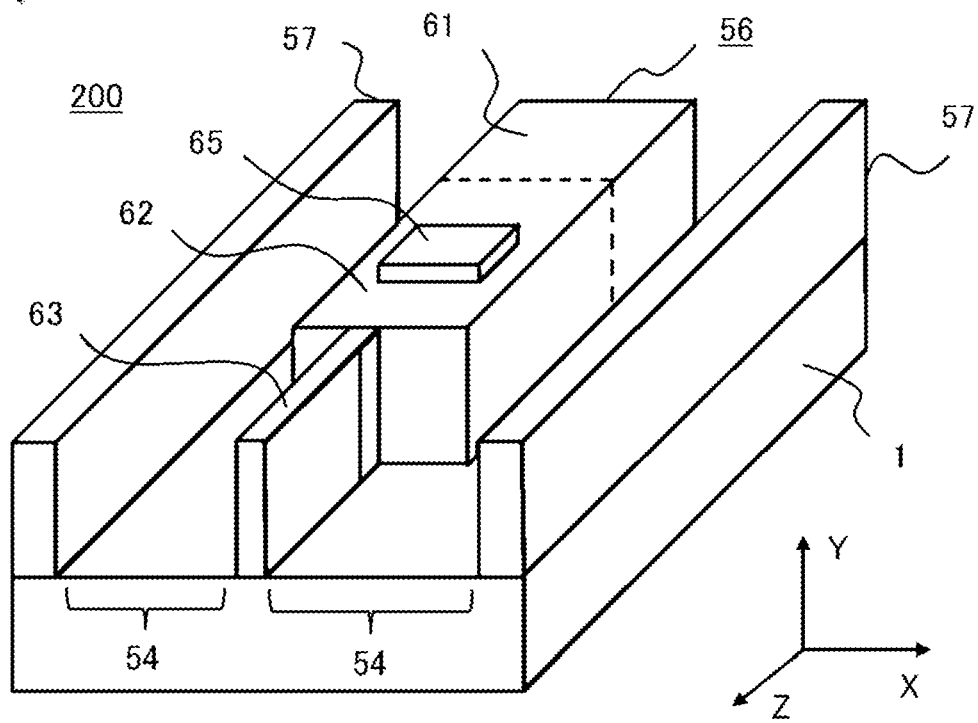
FIG. 1 is a bird's-eye view showing a semiconductor optical integrated device according to Embodiment 1.
Figure 2A:
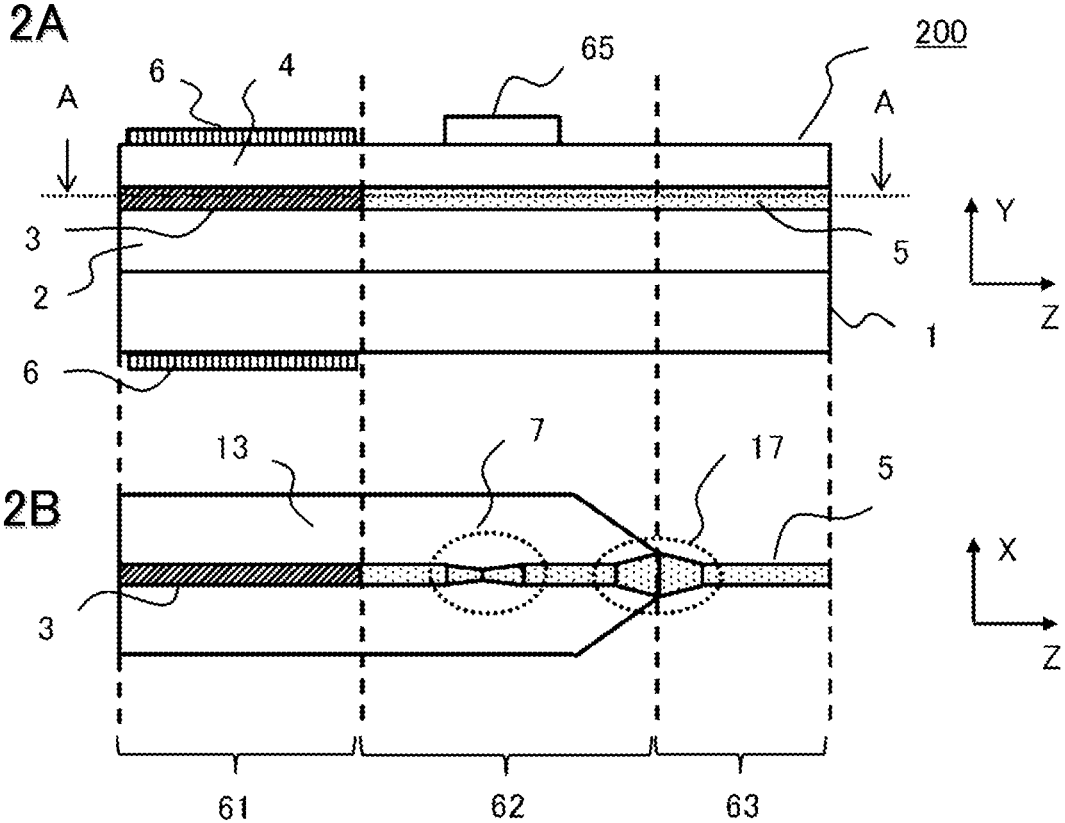
FIG. 2A is a sectional view of an optical-element-region mesa in FIG. 1, along a Z-direction.
Figure 2B:
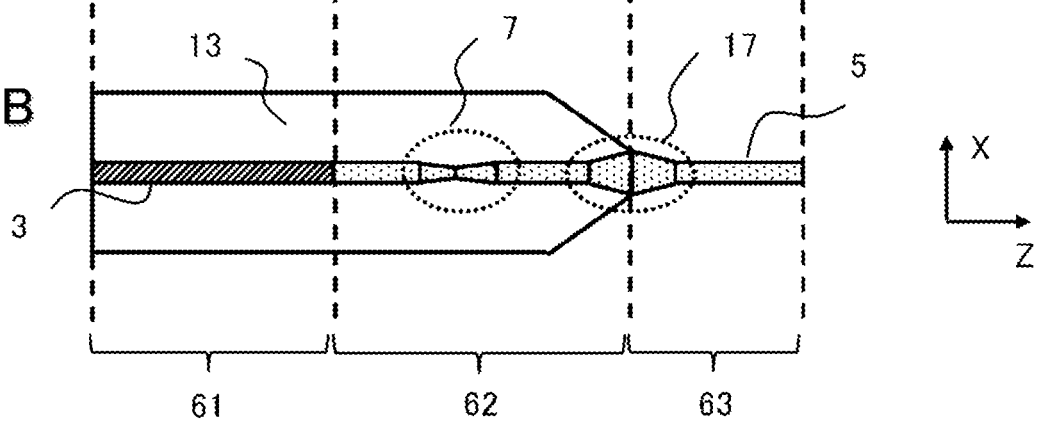
FIG. 2B is a sectional view on A-A in FIG. 2A.
Figure 5:
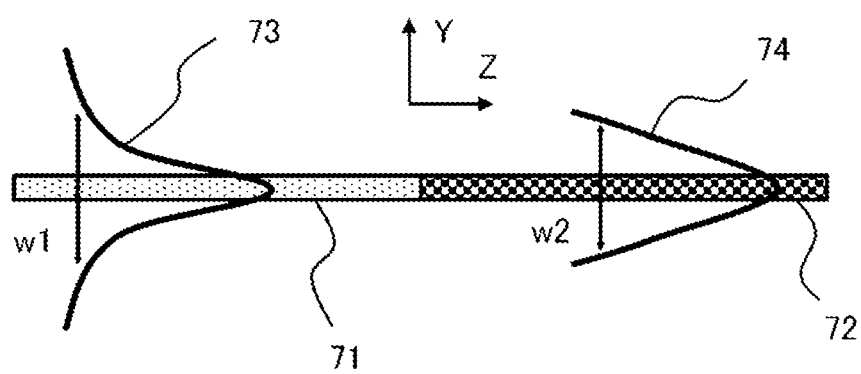
FIG. 5 is a diagram illustrating two light waveguides and their light distributions.
Figure 6:
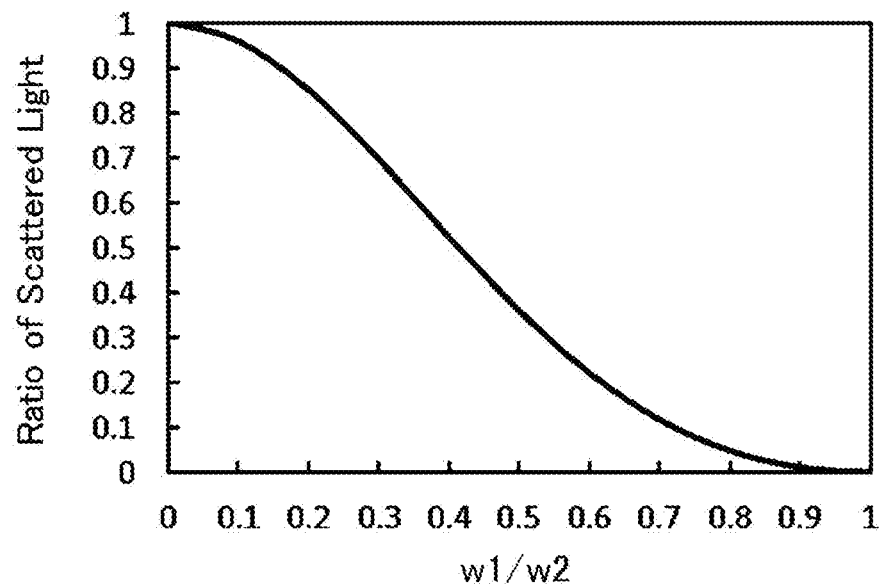
FIG. 6 is a diagram showing a ratio of scattered light caused by a joint portion between the light waveguides of FIG. 5.

FIG. 1 is a bird's-eye view showing a semiconductor optical integrated device according to Embodiment 1. FIG. 2A is a sectional view of an optical-element-region mesa in FIG. 1, along a Z-direction, and FIG. 2B is a sectional view on A-A in FIG. 2A. FIG. 3A to FIG. 3I and FIG. 4A to FIG. 4I are diagrams illustrating steps for manufacturing the semiconductor optical integrated device of FIG. 1. FIG. 5 is a diagram illustrating two light waveguides and their light distributions, and FIG. 6 is a diagram showing a ratio of scattered light caused by a joint portion between the light waveguides of FIG. 5. A semiconductor optical integrated device 200 includes: an InP substrate 1; an optical-element-region mesa 56; mesa grooves 54; side wall portions 57 separated by the mesa grooves 54 from the optical-element-region mesa 56; and a monitor PD 65 placed on the optical-element-region mesa 56. In the optical-element-region mesa 56 formed on the InP substrate 1, a first optical element 61, a buried light waveguide 62 provided as a monitoring light waveguide, and a second optical element 63 are formed. Here, description will be made assuming that the first optical element is a semiconductor laser, and the second optical element is a high-mesa light waveguide. Numeral 63 is also used as the sign of the high-mesa light waveguide. Because of the creation of the mesa grooves 54 by etching, the optical-element-region mesa 56 is mesa-shaped. In FIG. 1, a case is shown where the monitor PD 65 is placed on an outer periphery of the buried light waveguide 62, for example, on the top of the buried light waveguide 62; however, it may be placed on a side surface portion of the buried light waveguide 62, or on a back surface of the InP substrate 1. Note that, in FIG. 1, because power supply electrodes will make the diagram complex, they are omitted from illustration; however, actually, these power supply electrodes are present. In FIG. 2A, electrodes 6 of the first optical element 61 are shown. For the following description, coordinates X, Y and Z are defined as illustrated. A direction perpendicular to the InP substrate 1 is a Y-direction (Y-axis direction), a longitudinal direction of the semiconductor optical integrated device 200 that is perpendicular to the Y-direction, is a Z-direction (Z-axis direction), and a transverse direction of the semiconductor optical integrated device 200 that is perpendicular to the Y-direction and the Z-direction, is an X-direction (X-axis direction). In the semiconductor optical integrated device 200, the guided light propagates in the Z-direction.

With the assumption that the first optical element 61 is a semiconductor laser, the buried light waveguide 62 is joined thereto. Furthermore, the buried light waveguide 62 is joined to the high-mesa light waveguide 63 as the second optical element. Here, the first optical element 61 and the buried light waveguide 62 are joined to each other through a butt joint, and the buried light waveguide 62 and the high-mesa light waveguide 63 are joined to each other through a mode-conversion light waveguide 17. Further, in a light waveguide layer 5 placed inside the buried light waveguide 62, a scattered-light generation pattern 7 as a structure for getting scattered light is formed. The first optical element 61 is provided with: the InP substrate 1; an InP cladding layer 2 formed on the front surface of the InP substrate 1; an active layer 3 formed on the surface of the InP cladding layer 2; an InP cladding layer 4 formed on the surface of the active layer 3; the electrode 6 formed on the back surface of the InP substrate 1; and the other electrode 6 formed on the surface of the InP cladding layer 4. The buried light waveguide 62 is provided with: the InP substrate 1; the InP cladding layer 2 formed on the front surface of the InP substrate 1; the light waveguide layer 5 formed on the surface of the InP cladding layer 2; and the InP cladding layer 4 formed on the surface of the light waveguide layer 5. The high-mesa light waveguide 63 is provided with: the InP substrate 1; the InP cladding layer 2 formed on the front surface of the InP substrate 1; the light waveguide layer 5 formed on the surface of the InP cladding layer 2; and the InP cladding layer 4 formed on the surface of the light waveguide layer 5.

The first optical element 61 comprises a layered body which is formed on the InP substrate 1 as a semiconductor substrate and in which the InP cladding layer 2 as a first cladding layer, the active layer 3 and the InP cladding layer 4 as a second cladding layer, are successively stacked. The buried light waveguide 62 comprises a layered body which is formed on the InP substrate 1 as a semiconductor substrate and in which the InP cladding layer 2 as a first cladding layer, the light waveguide layer 5 and the InP cladding layer 4 as a second cladding layer, are successively stacked. The layered body of the buried light waveguide 62 has a buried structure provided with a pair of mesa facets which are opposite to each other in the X-direction perpendicular both to the Y-direction that is perpendicular to the InP substrate 1, and to the Z-direction that is the propagating direction of the light, and on which the light waveguide layer 5 is not exposed. The high-mesa light waveguide 63 comprises a layered body which is formed on the InP substrate 1 as a semiconductor substrate and in which the InP cladding layer 2 as a first cladding layer, the light waveguide layer 5 and the InP cladding layer 4 as a second cladding layer, are successively stacked. The layered body of the high-mesa light waveguide 63 has a high-mesa structure provided with a pair of mesa facets which are opposite to each other in the X-direction perpendicular both to the Y-direction that is perpendicular to the InP substrate 1, and to the Z-direction that is the propagating direction of the light, and on which the light waveguide layer 5 is exposed. Note that the configuration of first optical element 61/buried light waveguide 62/second optical element 63, may instead be a configuration of buried light waveguide/buried light waveguide/buried light waveguide, or that of high-mesa light waveguide/buried light waveguide/high-mesa light waveguide, or something like that. Thus, the configuration may be any configuration so long as its waveguide corresponding to the buried light waveguide 62 is of a buried type.

Figure 3A:
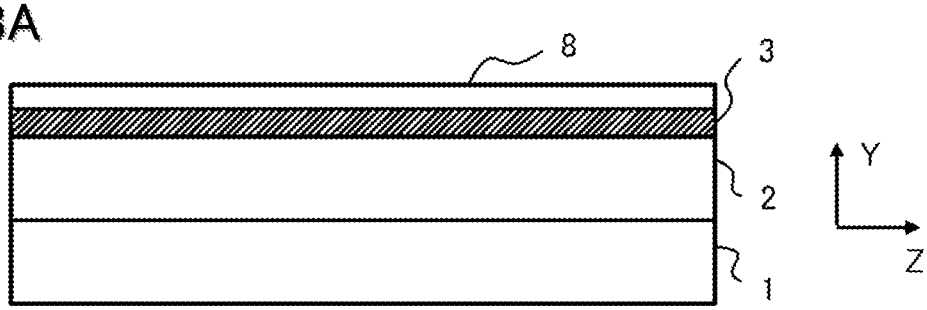
FIG. 3A is a diagram illustrating a step for manufacturing the semiconductor optical integrated device of FIG. 1.
Figure 3B:
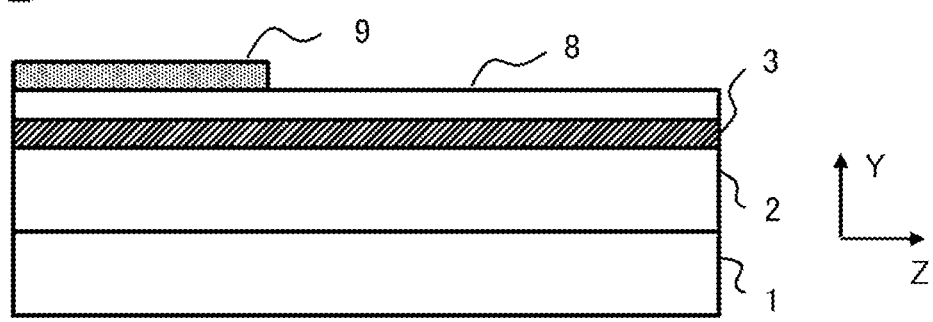
FIG. 3B is a diagram illustrating a step for manufacturing the semiconductor optical integrated device of FIG. 1.
Figure 3C:
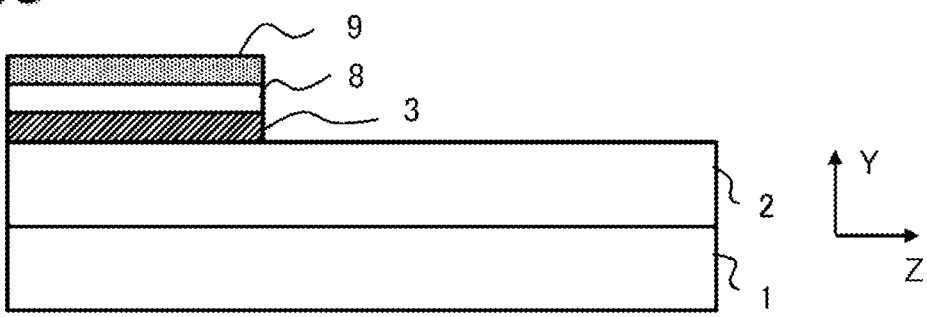
FIG. 3C is a diagram illustrating a step for manufacturing the semiconductor optical integrated device of FIG. 1.
Figure 3D:
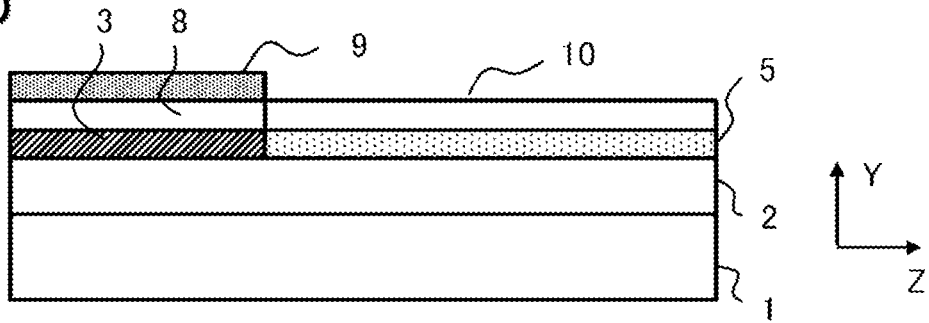
FIG. 3D is a diagram illustrating a step for manufacturing the semiconductor optical integrated device of FIG. 1.

A manufacturing method of the semiconductor optical integrated device 200 of Embodiment 1 will be described using FIG. 3A to FIG. 3I and FIG. 4A to FIG. 4I. FIG. 3A to FIG. 3E each show a cross-section of the optical-element-region mesa 56 along the Z-direction. FIG. 3F, FIG. 3G, FIG. 3I, FIG. 4A to FIG. 4D and FIG. 4F to FIG. 4I are diagrams each viewed from the side of the edge face of the high-mesa light waveguide 63, namely, from the guided-light output side. FIG. 3H and FIG. 4E each show a cross-section similar to the cross-section on A-A in FIG. 2A. As shown in FIG. 3A, using a crystal growth method such as an MOCVD (metal organic chemical vapor deposition) or the like, the InP cladding layer 2, the active layer 3 and an InP cladding layer 8 are stacked successively on the InP substrate 1. An insulative film 9 of $SiO_2$ or the like is deposited on the surface of the InP cladding layer 8, and is then patterned as shown in FIG. 3B. As shown in FIG. 3C, using the insulative film 9 as a mask, the InP cladding layer 8 and the active layer 3 corresponding to the exposed region are removed. As shown in FIG. 3D, using the insulative film 9 as a mask, the light waveguide layer 5 and an InP cladding layer 10 are crystal-grown successively by employing an MOCVD-based crystal growth technique. Note that no crystalline is grown on the insulative film 9. After the crystal growth, the insulative film 9 is removed by hydrofluoric acid or the like. Such a method of joining the active layer 3 with the light waveguide layer 5 by employing crystal growth, is referred to as a butt joint method.

Figure 3E:
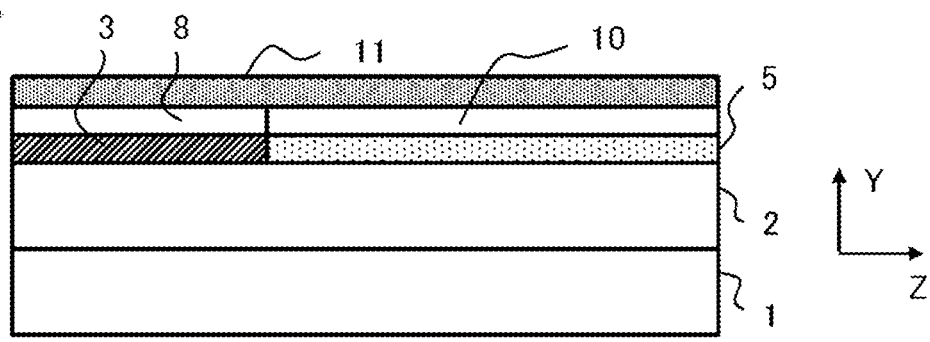
FIG. 3E is a diagram illustrating a step for manufacturing the semiconductor optical integrated device of FIG. 1.
Figure 3F:
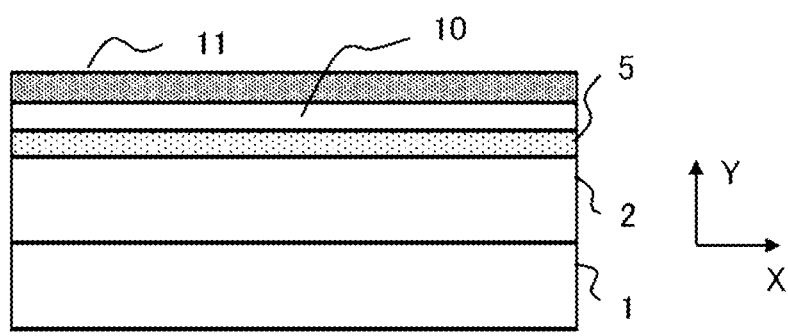
FIG. 3F is a diagram illustrating a step for manufacturing the semiconductor optical integrated device of FIG. 1.
Figure 3G:
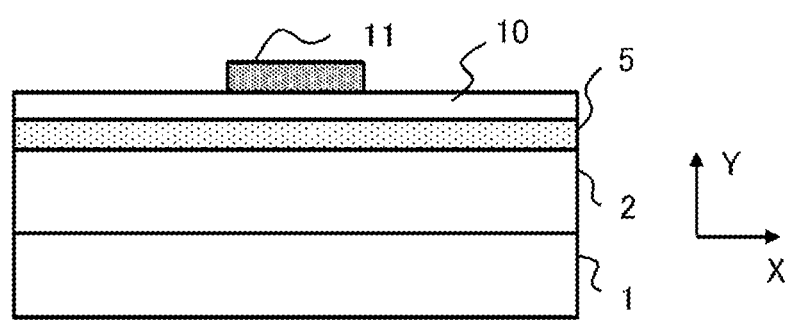
FIG. 3G is a diagram illustrating a step for manufacturing the semiconductor optical integrated device of FIG. 1.
Figure 3H:
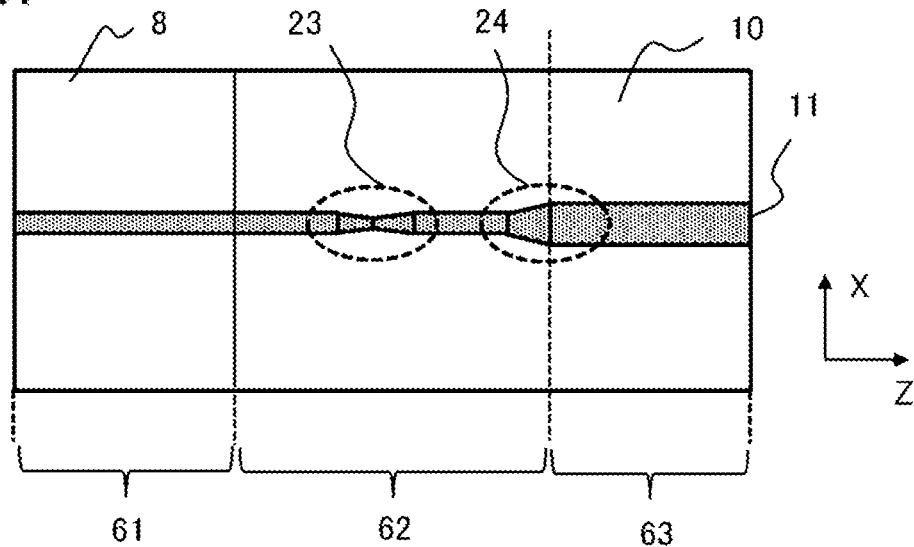
FIG. 3H is a diagram illustrating a step for manufacturing the semiconductor optical integrated device of FIG. 1.
Figure 3I:
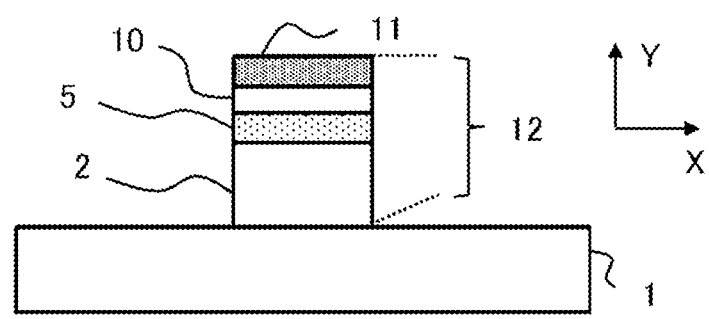
FIG. 3I is a diagram illustrating a step for manufacturing the semiconductor optical integrated device of FIG. 1.

As shown in FIG. 3E and FIG. 3F, on the surfaces of the InP cladding layer 8 and the InP cladding layer 10 from which the insulative film 9 was removed, an insulative film 11 of $SiO_2$ or the like is newly deposited. FIG. 3F is a diagram viewed from the right side of FIG. 3E, namely, from the side of the edge face of the high-mesa light waveguide 63. The insulative film 11 is formed into a pattern as shown in FIG. 3H. In the pattern-formed insulative film 11, a scattered-light-generation-pattern forming portion 23 is provided in order to form the scattered-light generation pattern 7 in the light waveguide layer 5 for generating scattered light. Further, in the pattern-formed insulative film 11, a mode-conversion-light-waveguide forming portion 24 is provided in order to form the mode-conversion light waveguide 17 in the light waveguide layer 5. Thereafter, as shown in FIG. 3I, using the patterned insulative layer 11 as a mask, portions of the InP cladding layers 8, 10, the active layer 3, the light waveguide layer 5 and the InP cladding layer 2 are removed, so that a ridge 12 is formed.

Figure 4A:
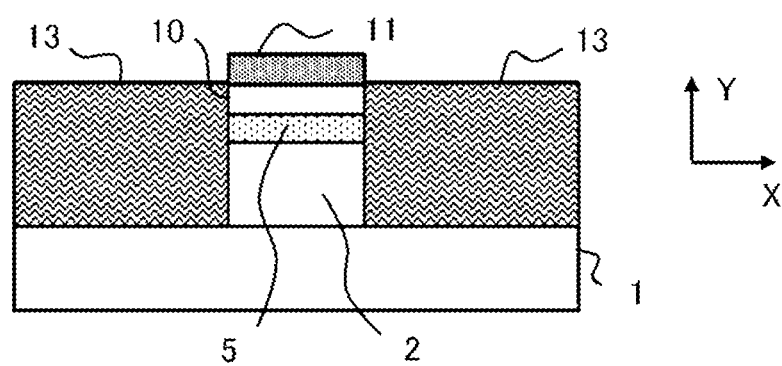
FIG. 4A is a diagram illustrating a step for manufacturing the semiconductor optical integrated device of FIG. 1.
Figure 4B:
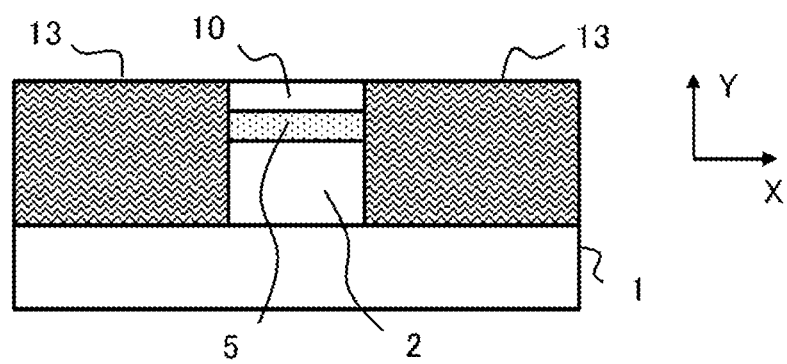
FIG. 4B is a diagram illustrating a step for manufacturing the semiconductor optical integrated device of FIG. 1.
Figure 4C:
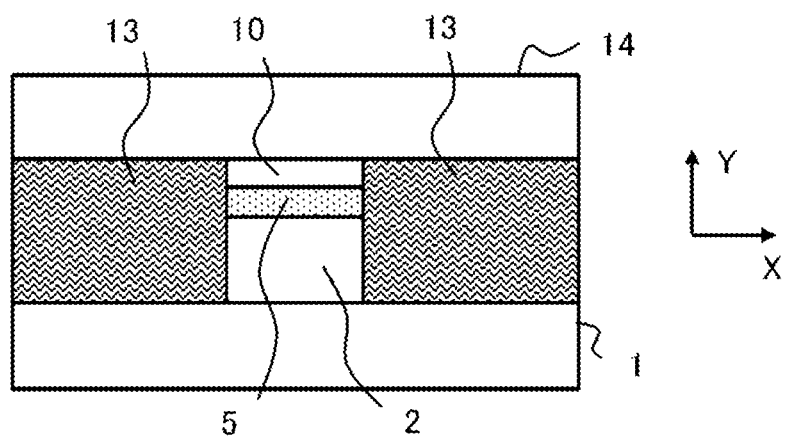
FIG. 4C is a diagram illustrating a step for manufacturing the semiconductor optical integrated device of FIG. 1.
Figure 4D:
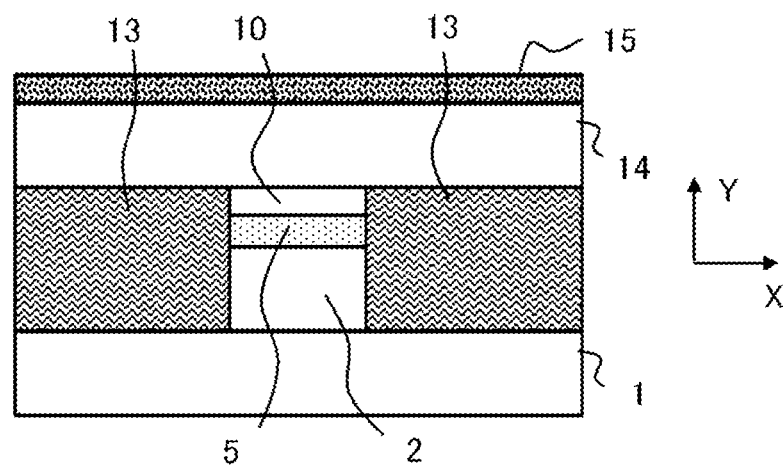
FIG. 4D is a diagram illustrating a step for manufacturing the semiconductor optical integrated device of FIG. 1.
Figure 4E:
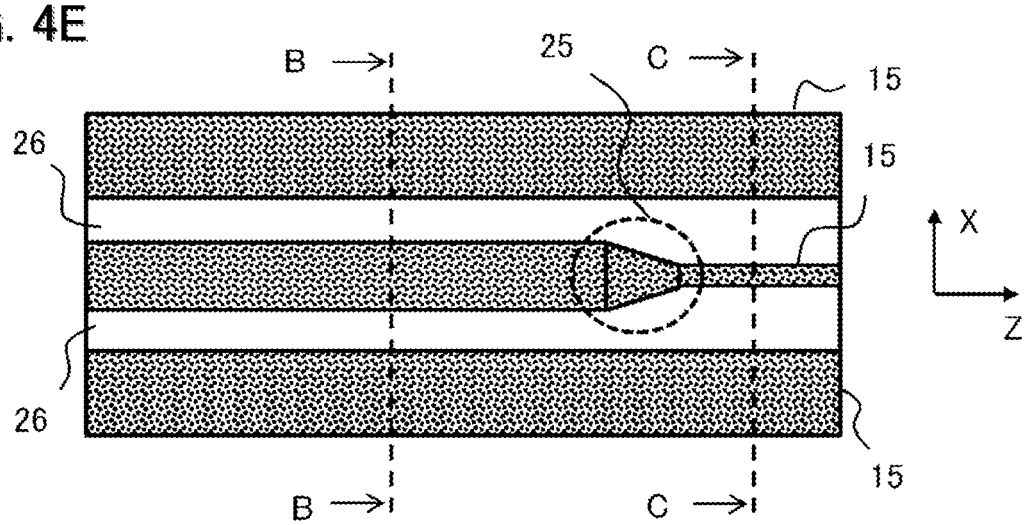
FIG. 4E is a diagram illustrating a step for manufacturing the semiconductor optical integrated device of FIG. 1.
Figure 4F:
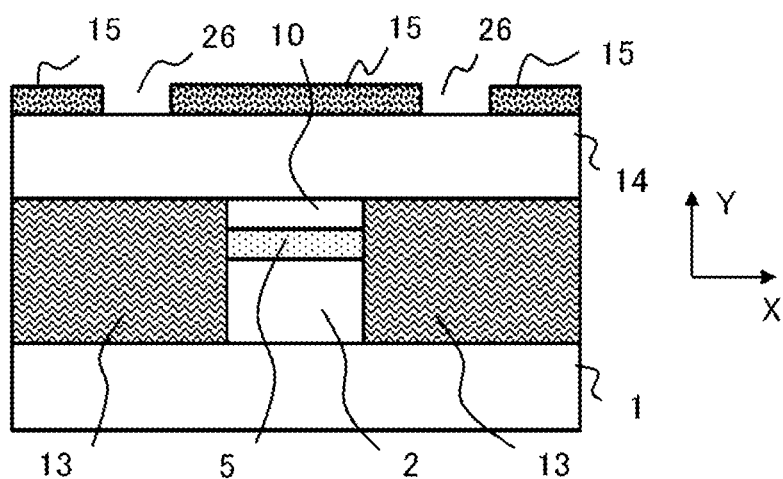
FIG. 4F is a diagram illustrating a step for manufacturing the semiconductor optical integrated device of FIG. 1.

As shown in FIG. 4A, using the insulative film 11 as a mask, electrical-current blocking layers 13 for confining the current in the active layer 3 are formed by employing crystal growth. As shown in FIG. 4B, the insulative film 11 is removed by hydrofluoric acid or the like. As shown in FIG. 4C, an InP cladding layer 14 is formed on the surfaces of the InP cladding layers 8, 10 and the electrical-current blocking layers 13, by employing crystal growth. Thereafter, as shown in FIG. 4D, an insulative film 15 of $SiO_2$ or the like is deposited on the surface of the InP cladding layer 14. As shown in FIG. 4E, the insulative film 15 is formed into a pattern having insulative-film open portions 26 for forming the mesa grooves 54. Further, in the pattern-formed insulative film 15, a mode-conversion-light-waveguide forming portion 25 is provided in order to form the mode-conversion light waveguide 17 in the light waveguide layer 5. FIG. 4F shows a cross-section on B-B in FIG. 4E. Using the insulative film 15 as a mask, portions of the InP cladding layer 14 and the electrical-current blocking layers 13 are removed by etching through the insulative-film open portions 26 by employing a dry etching technique. Note that, in FIG. 4G to FIG. 4I, the mesa grooves 54 with partial cut-out regions in the InP substrate 1 are shown. It is of no matter that the InP substrate 1 is partially cut out around the bottoms of the mesa grooves 54. In FIG. 1, the mesa grooves 54 with no cut-out regions in the InP substrate 1 are shown.

Figure 4G:
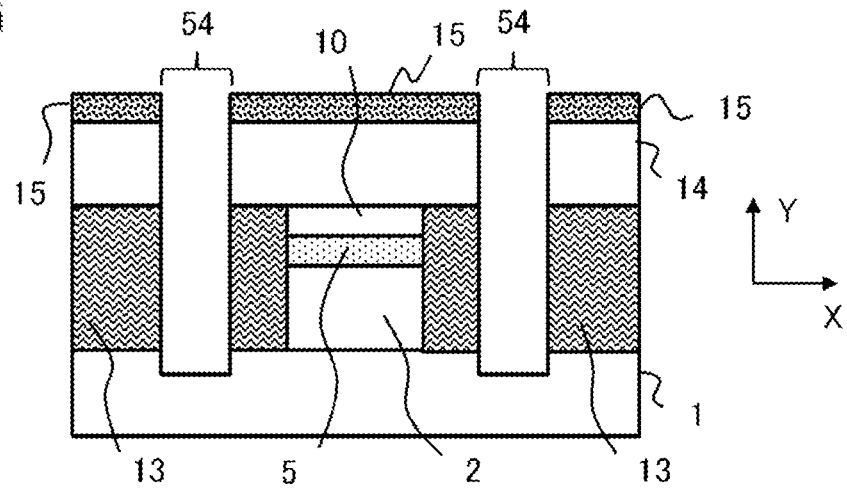
FIG. 4G is a diagram illustrating a step for manufacturing the semiconductor optical integrated device of FIG. 1.

FIG. 4G is a sectional view after creation of the mesa grooves 54, corresponding to that on B-B shown in FIG. 4E. Etching for creating the mesa grooves 54 is performed in a manner to penetrate through the electrical-current blocking layers 13. Note that the ridge 12 shown in FIG. 3I that includes the light waveguide layer 5 and the active layer 3, is not subjected to etching. Such a structure is referred to as a buried-type light waveguide.

Figure 4H:
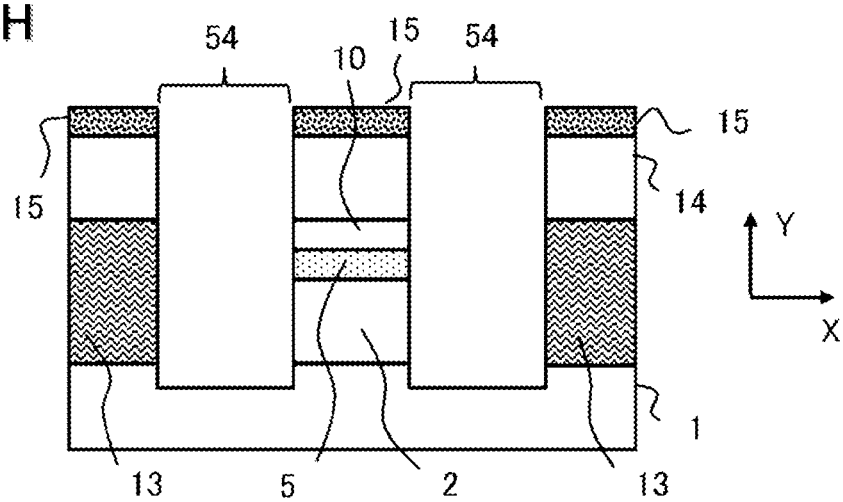
FIG. 4H is a diagram illustrating a step for manufacturing the semiconductor optical integrated device of FIG. 1.

FIG. 4H is a sectional view after creation of the mesa grooves 54, corresponding to that on C-C shown in FIG. 4E. As shown in FIG. 4H, the InP cladding layer 14 and the electrical-current blocking layers 13 are etched so that, in the mesa to be provided as the high-mesa light waveguide 63, the electrical-current blocking layer 13 is not placed, but the light waveguide layer 5 is solely left. Such a structure is referred to as a high-mesa light waveguide.

Figure 4I:
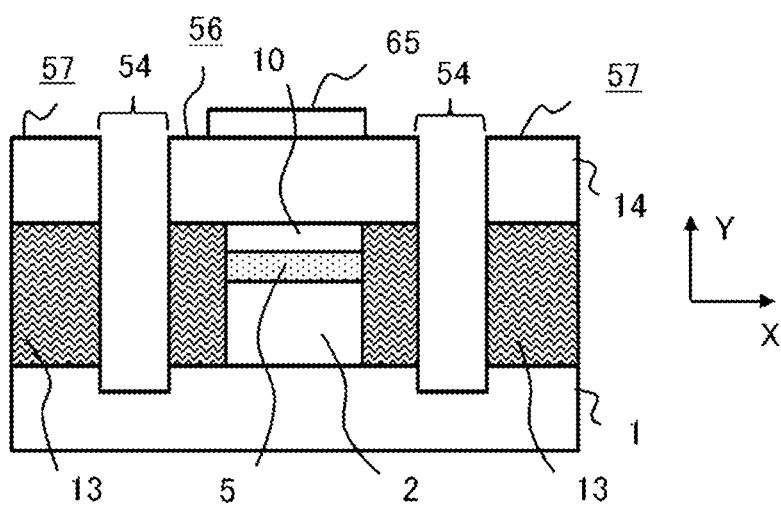
FIG. 4I is a diagram illustrating a step for manufacturing the semiconductor optical integrated device of FIG. 1.

As shown in FIG. 4I, the insulative film 15 is removed by hydrofluoric acid or the like, and then the monitor PD 65 is placed on the upper side of the buried light waveguide 62, more specifically, on the InP cladding layer 14 in the buried light waveguide 62. Note that the InP cladding layer 4 shown in FIG. 1 and FIG. 2A comprises stacked cladding layers, and it is constituted, in the buried light waveguide 62 and the high-mesa light waveguide 63, by the lower InP cladding layer 10 and the upper InP cladding layer 14, and it is constituted, in the first optical element 61, by the lower InP cladding layer 8 and the upper InP cladding layer 14.

Description will be made about a light waveguide for generating scattered light. A light waveguide shown in FIG. 5 comprises two light waveguides, namely, a first light waveguide 71 and a second light waveguide 72 joined to each other. Further, in FIG. 5, respective waveguide modes (light distributions) with which the first light waveguide 71 and the second light waveguide 72 can guide the light, are shown. The light distribution of the light guided by the first light waveguide 71 is a light distribution 73, and the light distribution of the light guided by the second light waveguide 72 is a light distribution 74. The mode field diameter of the light distribution 73 is a mode field diameter of w1, and the mode field diameter of the light distribution 74 is a mode field diameter of w2. Note that the mode field diameter means a diameter (width) in a light distribution of a waveguide mode, at which the intensity becomes $1/e^2$ times the peak intensity in that light distribution. Note that the first light waveguide 71 and the second light waveguide 72 shown in FIG. 5 correspond to the active layer 3 or the light waveguide layer 5 shown in FIG. 2A. Hereinafter, description will be made using the mode field diameter. When the mode field diameters of the respective light waveguides are mutually different, the light having propagated through the first light waveguide 71 cannot be fully coupled to the second light waveguide 72, and only its components that meet the waveguide mode of the second light waveguide 72 will be coupled to the second light waveguide 72. Any component that could not be coupled thereto is emitted as scattered light. Detailed explanation thereof is described in pages 29 to 36 of Non-Patent Document 1 "Foundation and Application of Optical Coupling System for Optical Device" by Kenji Kawano, 2nd edition, Japan.

For simplification's sake, consideration will be made using two dimensions (Z-Y plane). With the definition that the mode field diameter of the first light waveguide 71 is w1 and the mode field diameter of the second light waveguide 72 is w2, in FIG. 6, there are shown: a rate w1/w2 of respective mode field diameters of the light waveguides; and a ratio of scattered light relative to the light having propagated through the first light waveguide 71, said scattered light generated by scattering at the time the light is inputted into the second light waveguide 72. The characteristic of the ratio of the scattered light shown in FIG. 6 was derived from the relational expression shown in Non-Patent Document 1 between a coupling efficiency 11 and the rate w1/w2 of the mode field diameters. Accordingly, it is possible to achieve scattered light with any given intensity by adjusting the rate of the mode field diameter w1 to the mode field diameter w2 at the joint portion between these two light waveguides.

The waveguide mode and the mode field diameter will be described. The waveguide mode means a distribution of light in a light waveguide that allow the light to propagate therethrough, and in general, a mode called a fundamental mode is taken for use. Here, how a light distribution is derived in the fundamental mode will be described. In FIG. 2A and FIG. 2B, it is now defined that the refractive indexes of the InP cladding layer 2 and the InP cladding layer 4 in the buried light waveguide 62 are $n_{c1}$ and $n_{c2}$, respectively. it is now defined that the refractive index of the light waveguide layer 5 is $n_j$ and a layer thickness thereof is $d_j$. The buried light waveguide 62 has a structure in which the light waveguide layer 5 is sandwiched between the InP cladding layer 2 and the InP cladding layer 4. The stacked direction given from the InP cladding layer 2 to the InP cladding layer 4 is the Y-direction as shown in FIG. 2. Note that in each mathematical formula, a small letter of "y" is used. Note that, where appropriate, the Y-direction is indicated as the y-direction. Further, as shown in FIG. 2B, a direction perpendicular to the Y-direction, namely, the transverse direction of the semiconductor optical integrated device 200 is the X-direction. The X-direction will also be indicated in a manner similar to the Y-direction. A small letter of "x" is used in each mathematical formula, and where appropriate, the X-direction is indicated as the x-direction.

An optical electric-field distribution of the guided light along the y-direction that is the stacked direction of the respective layers, is represented by E(y). Optical electric-field distributions of the InP cladding layer 2, the light waveguide layer 5 and the InP cladding layer 4 will be shown below. An optical electric field $E_{c1}(y)$ at the InP cladding layer 2 is represented as shown in a formula (1).

[Mathematical 1]

$$E_{c1}(y)=D_1 \exp(\gamma_{c1} y) \tag{1}$$

The coefficient $\gamma_{c1}$ in the formula (1) is represented as shown in a formula (2).

[Mathematical 2]

$$\gamma_{c1}=k_0\sqrt{(n_y^2-n_{c1}^2)} \tag{2}$$

Here, $n_y$ denotes a transmission refractive index, and $k_0$ denotes a wave number in vacuum. $D_1$ is an optional coefficient.

An optical electric field $E_j(y)$ at the light waveguide layer 5 is represented as shown in a formula (3).

[Mathematical 3]

$$E_j(y)=A_j \cos(\gamma_j(y-d_j))+B_j \sin(\gamma_j(y-d_j)) \tag{3}$$

The coefficient $\gamma_j$ in the formula (3) is represented as shown in a formula (4).

[Mathematical 4]

$$\gamma_j=k_0\sqrt{(n_j^2-n_y^2)} \tag{4}$$

Here, $A_j$ and $B_j$ are each an optional coefficient.

An optical electric field $E_{c2}(y)$ at the InP cladding layer 4 is represented as shown in a formula (5).

[Mathematical 5]

$$E_{c2}(y)=D_2 \exp(\Gamma_{c2} y) \tag{5}$$

The coefficient $\gamma_{c2}$ in the formula (5) is represented as shown in a formula (6).

[Mathematical 6]

$$\gamma_{c2}=k_0\sqrt{(n_y^2-n_{c2}^2)} \tag{6}$$

Here, $n_y$ denotes a transmission refractive index, and $k_0$ denotes a wave number in vacuum. $D_2$ is an optional coefficient.

With respect to an optical electric-field intensity $E^2(y)$ in the optical electric-field distribution E(y), a mode field diameter along the y-direction is a diameter which is placed on the InP substrate 1-side in that distribution and at which the optical electric-field intensity $E^2(y)$ becomes $1/e^2$ times the peak intensity. From the optical electric field intensity $E_{c1}^2(y)$ at the InP cladding layer 2, it is possible to calculate the mode field diameter along the y-direction at the InP cladding layer 2. From the optical electric field $E_j(y)$ at the light waveguide layer 5, it is possible to calculate the mode field diameter along the y-direction at the light waveguide layer 5. From the optical electric field $E_{c2}(y)$ at the InP cladding layer 4, it is possible to calculate the mode field diameter along the y-direction at the InP cladding layer 4.

Next, an electric field in the x-direction is calculated by an effective index method. With respect to the x-direction structure of the buried light waveguide 62, as shown in FIG. 2B and FIG. 4I, the light waveguide layer 5 is sandwiched, at its plus and minus sides in the x-direction (left and right sides in FIG. 4I), by the electric-current blocking layers 13. It is now defined that the refractive indexes of the electric-current blocking layers 13 on the left and right sides in FIG. 4I are $n_{b1}$ and $n_{b2}$, respectively. It is now defined that the refractive index of the light waveguide layer 5 is $n_j$ and the width thereof is $t_j$, and its electric field distribution along the x-direction is E(x). The optical electric fields $E_{b1}(x)$ and $E_{b2}(x)$ at the electric-current blocking layers 13 can be represented as shown in a formula (7) and a formula (9), respectively. Where appropriate, the electric-current blocking layer 13 on the plus side in the x-direction (left side in FIG. 4I) will be referred to as a first electric-current blocking layer 13, and the electric-current blocking layer 13 on the minus side in the x-direction (right side in FIG. 4I) will be referred to as a second electric-current blocking layer 13.

An optical electric field $E_{b1}(x)$ at the first electric-current blocking layer 13 can be represented as shown in a formula (7).

[Mathematical 7]

$$E_{b1}(x)=F_1 \exp(\gamma_{b1} x) \tag{7}$$

The coefficient $\gamma_{b1}$ in the formula (7) is represented as shown in a formula (8).

[Mathematical 8]

$$\gamma_{b1}=k_0\sqrt{(n_x^2-n_{b1}^2)} \tag{8}$$

An optical electric field $E_{b2}(x)$ at the second electric-current blocking layer 13 can be represented as shown in a formula (9).

[Mathematical 9]

$$E_{b2}(x)=F_2 \exp(\gamma_{b2} x) \tag{9}$$

The coefficient $\gamma_{b2}$ in the formula (9) is represented as shown in a formula (10).

[Mathematical 10]

$$\Gamma_{b2}=k_0\sqrt{(n_x^2-n_{b2}^2)} \tag{10}$$

Here, $n_x$ denotes a transmission refractive index, and $k_0$ denotes a wave number in vacuum. $F_1$ and $F_2$ are each an optional coefficient.

An optical electric field $E_j(x)$ at the light waveguide layer 5 can be represented as shown in a formula (11).

[Mathematical 11]

$$E_j(x)=G_j \cos(\zeta_j(x-t_j))+H_j \sin(\zeta_j(x-t_j)) \tag{11}$$

The coefficient $\zeta_j$ in the formula (11) is represented as shown in a formula (12).

[Mathematical 12]

$$\zeta_j=k_0\sqrt{(n_j^2-n_x^2)} \tag{12}$$

Here, $G_j$ and $H_j$ are each an optional coefficient.

With respect to an optical electric-field intensity $E^2(x)$ in the optical electric-field distribution E(x), a mode field diameter along the x-direction is a diameter which is placed on the substrate side in that distribution and at which the optical electric-field intensity $E^2(x)$ becomes $1/e^2$ times the peak intensity. From the optical electric field $E_{b1}(x)$ at the first electric-current blocking layer 13, it is possible to calculate the mode field diameter along the x-direction at the first electric-current blocking layer 13. From the optical electric field $E_{b2}(x)$ at the second electric-current blocking layer 13, it is possible to calculate the mode field diameter along the x-direction at the second electric-current blocking layer 13. From the optical electric field $E_j(x)$ at the light waveguide layer 5, it is possible to calculate the mode field diameter along the x-direction at the light waveguide layer 5.

In order to design the mode field diameter, the refractive indexes $n_{c1}$, $n_{c2}$, $n_{b1}$, $n_{b2}$, $n_j$ of the respective layers in the buried light waveguide 62 are varied based on the formula (1) to the formula (12). Instead, the thickness and the width $t_j$ of the light waveguide layer 5 are varied. When the refractive indexes $n_{c1}$, $n_{c2}$, $n_{b1}$, $n_{b2}$, $n_j$ of the respective layers in the buried light waveguide 62, or the thickness $d_j$ and the width $t_j$ of the light waveguide layer 5, are each adjusted to any desired value, a light-waveguide-mode shape (light distribution) varies. Thus, the mode field diameter varies as the light-waveguide-mode shape (light distribution) varies. The scattered-light generation pattern 7 provided as a light scattering portion for generating scattered light, has a structure in which light waveguides having different mode field diameters are combined.

In Embodiment 1, as shown in FIG. 2B, as the scattered-light generation pattern 7 for generating scattered light, a constructed shape is partly formed in the light waveguide layer 5. This causes variation in refractive index to thereby generate scattered light.

Description will be made about the emission angle of the scattered light. The emission angle of the scattered light depends on a pattern for causing scattering. Generally, the more steeply the refractive index varies in a light waveguide layer, the closer the angle at which the scattered light is scattered becomes to the right angle relative to the light waveguide layer. This is because, when the refractive index of the light waveguide layer varies steeply, the light propagating in the light waveguide layer cannot follow that variation (mode conversion that is matched to the waveguide modes of respective light waveguide layers, cannot be achieved), so that scattering occurs at a position where the refractive index of the light waveguide layer varies, for example, at a position where the width of the light waveguide layer varies. In contrast, when the refractive index of the light waveguide layer varies moderately, the light propagating in the light waveguide layer can follow that variation (mode conversion that is matched to the waveguide modes of the respective light waveguide layers is achieved), resulting in a small amount of scattered light components. The scattered light is emitted frontward of the scattered-light generation pattern 7 for generating scattered light that is formed in the light waveguide layer.

Description will be made about the placement position of the monitor PD 65. Since the scattered light is emitted frontward of the scattered-light generation pattern 7, the monitor PD 65 is placed so as to cover a portion ahead of the scattered-light generation pattern 7 for generating scattered light while covering that pattern, and so as to be placed at a location in which the intensity of scattered light that reaches the placement surface of the monitor PD 65 becomes highest. The placement position for the monitor PD 65 varies depending on the light waveguide shape of the scattered-light generation pattern 7 for generating scattered light that is formed in the light waveguide layer 5. When the thickness of the InP cladding layer 4 as a top portion of the buried light waveguide 62 varies, the position for the monitor PD 65 also varies. Since the scattered light is emitted frontward, when the thickness of the InP cladding layer 4 is small, the monitor PD 65 is placed adjacent to and above the scattered-light generation pattern 7. When the thickness of the InP cladding layer 4 is large, since the scattered light will reach an upper portion (surface) of the InP cladding layer 4 at a great distance in a propagating direction of the scattered light, the monitor PD 65 is placed at a great distance from the scattered-light generation pattern 7.

Accordingly, with respect to the placement position and the light receiving area of the monitor PD 65, it is desired to place the monitor PD to be positioned so as to cover a portion ahead in the guided direction of the scattered-light generation pattern 7 for generating scattered light, and so as to be centered on a position where the intensity of scattered light becomes highest, said monitor PD having a light receiving area capable of fully covering the light distribution of the scattered light having reached that monitor PD. Note that the light receiving area of the monitor PD 65 may be set to any light receiving area so long as a required monitoring-current value can be obtained thereby and the monitor PD is placed in a region where a necessary intensity of scattered light can be obtained.

With respect to the buried light waveguide 62, a Y-direction distance from the light waveguide layer 5 to the monitor PD 65, namely, the thickness of the InP cladding layer 4 is set to such a thickness that is larger than the mode filed diameter of the guided light and that does not allow evanescent light to be caught in the monitor PD 65. At the time of manufacturing the semiconductor optical integrated device 200, the thickness of the InP cladding layers 10, 14 is set to be larger than the mode field diameter of the guided light and not to allow the evanescent light to be caught in the monitor PD 65.

The scattered light generated by the scattered-light generation pattern 7 for generating scattered light, propagates through the InP cladding layer 4 on the top of the light waveguide layer 5 in the buried light waveguide 62, and is then incident on the placed monitor PD 65. The guided light that has passed through the scattered-light generation pattern 7 for generating scattered light, is coupled to the light waveguide layer 5 again and propagates therethrough. With use of the scattered light, reflection may occur at a mesa side surface of the buried light waveguide 62; however, since the incident angles of scattered light on the mesa side surface are random, such scattered light that returns from the mesa side surface to the input side (the first optical element 61-side) is negligible.

According to the semiconductor optical integrated device 200 of Embodiment 1, since the scattered light is received by the monitor PD 65, it is possible to obtain a monitoring current corresponding to the light intensity of the guided light. The semiconductor optical integrated device 200 of Embodiment 1 serves to receive the scattered light, so that, unlike the case described in Patent Document 1 where the evanescent light is received, the guided light never makes direct contact with the light receiving portion (absorption layer) of the monitor PD 65, and thus there is no effect on the guided light. Further, according to the semiconductor optical integrated device 200 of Embodiment 1, since the distribution of the guided light is wider than the Y-direction thickness of the light waveguide layer 5 and, than the X-direction width thereof, symmetry of the light distribution is not seriously impaired even after the light has passed through the scattered-light generation pattern 7 for generating scattered light. In the semiconductor optical integrated device 200 of Embodiment 1, there is no return light toward the active layer 3 in the first optical element 61, so that abnormal oscillation due to noise caused by the return light does not occur in the semiconductor laser, namely, an LD (Laser Diode). In conclusion, the semiconductor optical integrated device 200 of Embodiment 1 can monitor the intensity of the light propagating through the light waveguide, without affecting the light distribution of that light and without deteriorating characteristics of the optical element on the light incident side, and is thus well suited as an integrated device in which a monitor PD is provided at the middle of a light waveguide.

As described above, the semiconductor optical integrated device 200 of Embodiment 1 is a semiconductor optical integrated device in which the first optical element 61, the monitoring light waveguide (buried light waveguide 62) and the second optical element 63, through which light propagates, are formed on a common semiconductor substrate (InP substrate 1), wherein the monitoring light waveguide (buried light waveguide 62) is joined to the first optical element 61, and the second optical element 63 is joined to the monitoring light waveguide (buried light waveguide 62).[Feature 1]

The monitoring light waveguide (buried light waveguide 62) includes the light scattering portion (scattered-light generation pattern 7) for scattering a part of the light, which is composed of a combination of light waveguides having different mode field diameters; and a light detector (monitor PD 65) for receiving scattered light scattered by the light scattering portion (scattered-light generation pattern 7) is placed on an outer periphery of the monitoring light waveguide (buried light waveguide 62), or on a back surface of the semiconductor substrate (InP substrate 1) on its side opposite to that facing the light scattering portion (scattered-light generation pattern 7).[Feature 2]

According to Feature 1 and Feature 2, in the semiconductor optical integrated device 200 of Embodiment 1, the light detector (monitor PD 65) for receiving scattered light scattered by the light scattering portion (scattered-light generation pattern 7) in the monitoring light waveguide (buried light waveguide 62) for scattering a part of the light, is placed on an outer periphery of the monitoring light waveguide (buried light waveguide 62), or on a back surface of the semiconductor substrate (InP substrate 1) on its side opposite to that facing the light scattering portion (scattered-light generation pattern 7). This makes it possible to monitor the intensity of the light propagating through the light waveguide (buried light waveguide 62) without affecting the light distribution of that light and without deteriorating characteristics of the optical element on the light incident side.

Embodiment 2

Figure 7:
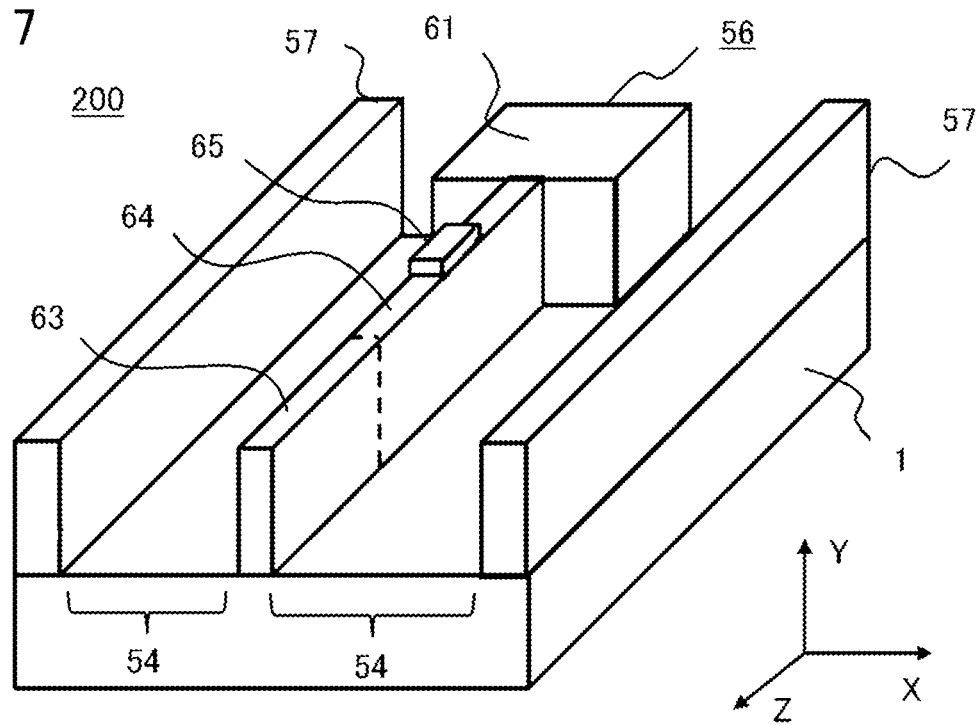
FIG. 7 is a bird's-eye view showing a semiconductor optical integrated device according to Embodiment 2.

FIG. 7 is a bird's-eye view showing a semiconductor optical integrated device according to Embodiment 2. FIG. 8A is a sectional view of an optical-element-region mesa in FIG. 7, along a Z-direction, and FIG. 8B is a sectional view on A-A in FIG. 8A. A semiconductor optical integrated device 200 of Embodiment 2 results from replacing the buried light waveguide 62 in the semiconductor optical integrated device 200 of Embodiment 1, with a high-mesa light waveguide 64 as a light waveguide having a high mesa structure. The high-mesa light waveguide 64 that is a monitoring light waveguide, comprises a layered body which is formed on an InP substrate 1 as a semiconductor substrate and in which an InP cladding layer 2 as a first cladding layer, a light waveguide layer 5 and an InP cladding layer 4 as a second cladding layer, are successively stacked. The layered body of the high-mesa light waveguide 64 has the high-mesa structure provided with a pair of mesa facets which are opposite to each other in an X-direction perpendicular both to a Y-direction that is perpendicular to the InP substrate 1, and to a Z-direction that is the propagating direction of the light, and on which the light waveguide layer 5 is exposed. A monitor PD 65 is placed on an outer periphery of the high-mesa light waveguide 64, for example, on the top (surface) of the high-mesa light waveguide 64. As shown in FIG. 8B, a scattered-light generation pattern 7 for generating scattered light is a width-changed portion in the high-mesa light waveguide 64.

The placement position and the area of the monitor PD 65 are similar to those in Embodiment 1. It is appropriate to place the monitor PD 65 so as to cover a portion ahead in the guided direction of the scattered-light generation pattern 7 for generating scattered light, and so as to be placed at a location where the monitor PD can receive all the scattered light having reached the upper face (surface) of the InP cladding layer 4, said location being centered on a position where the intensity of scattered light becomes highest. Note that the position and the light receiving area of the monitor PD 65 may be adjusted according to a required monitoring-current value.

The semiconductor optical integrated device 200 of Embodiment 2 achieves functions and effects similar to those by the semiconductor optical integrated device 200 of Embodiment 1. The semiconductor optical integrated device 200 of Embodiment 2 can monitor the intensity of the light propagating through the light waveguide (high-mesa light waveguide 64) without affecting the light distribution of that light and without deteriorating characteristics of the optical element on the light incident side.

As described above, the semiconductor optical integrated device 200 of Embodiment 2 is a semiconductor optical integrated device in which the first optical element 61, the monitoring light waveguide (high-mesa light waveguide 64) and the second optical element 63, through which light propagates, are formed on a common semiconductor substrate (InP substrate 1), wherein the monitoring light waveguide (high-mesa light waveguide 64) is joined to the first optical element 61, and the second optical element 63 is joined to the monitoring light waveguide (high-mesa light waveguide 64).[Feature 1]

The monitoring light waveguide (high-mesa light waveguide 64) includes a light scattering portion (scattered-light generation pattern 7) for scattering a part of the light, which is composed of a combination of light waveguides having different mode field diameters; and a light detector (monitor PD 65) for receiving scattered light scattered by the light scattering portion (scattered-light generation pattern 7) is placed on an outer periphery of the monitoring light waveguide (high-mesa light waveguide 64), or on a back surface of the semiconductor substrate (InP substrate 1) on its side opposite to that facing the light scattering portion (scattered-light generation pattern 7).[Feature 2]

The monitoring light waveguide (high-mesa light waveguide 64) comprises a layered body which is formed on the semiconductor substrate (InP substrate 1) and in which the first cladding layer (InP cladding layer 2), the light waveguide layer 5 and the second cladding layer (InP cladding layer 4) are successively stacked; wherein the layered body has a high-mesa structure provided with a pair of mesa facets which are opposite to each other in the X-direction perpendicular both to the Y-direction that is perpendicular to the semiconductor substrate (InP substrate 1), and to the Z-direction that is the propagating direction of the light, and on which the light waveguide layer 5 is exposed.[Feature 3]

According to Feature 1 to Feature 3, in the semiconductor optical integrated device 200 of Embodiment 2, the light detector (monitor PD 65) for receiving scattered light scattered by the light scattering portion (scattered-light generation pattern 7) in the monitoring light waveguide (high-mesa light waveguide 64) for scattering a part of the light, is placed on an outer periphery of the monitoring light waveguide (high-mesa light waveguide 64), or on a back surface of the semiconductor substrate (InP substrate 1) on its side opposite to that facing the light scattering portion (scattered-light generation pattern 7). This makes it possible to monitor the intensity of the light propagating through the light waveguide (high-mesa light waveguide 64) without affecting the light distribution of that light and without deteriorating characteristics of the optical element on the light incident side.

Embodiment 3

In Embodiment 3, a scattered-light generation pattern that is different to those in Embodiment 1 and Embodiment 2 will be described. FIG. 9 is a diagram showing a scattered-light generation pattern according to Embodiment 3, and FIG. 10 is a diagram showing another scattered-light generation pattern according to Embodiment 3. FIG. 11A to FIG. 11E are each a diagram for illustrating a first manufacturing method in which the scattered-light generation pattern of FIG. 10 is formed. FIG. 12A to FIG. 12D are each a diagram for illustrating a second manufacturing method in which the scattered-light generation pattern of FIG. 10 is formed. A semiconductor optical integrated device 200 of Embodiment 3 results from changing the scattered-light generation pattern in the semiconductor optical integrated device 200 of Embodiment 1 or Embodiment 2, to the scattered-light generation pattern 7 shown in FIG. 9 or FIG. 10.

It suffices that the scattered-light generation pattern for generating scattered light is a refractive-index changing portion in a light waveguide. Shown in FIG. 9 is an example of the scattered-light generation pattern 7. FIG. 9 corresponds to a main part in the Z-X directional cross-section of the buried light waveguide 62 of Embodiment 1 (see, FIG. 2B). The scattered-light generation pattern 7 in Embodiment 1 was an example in which the X-direction width of the light waveguide layer 5 is narrowed. The scattered-light generation pattern 7 in Embodiment 3 here is an example in which the width of the light waveguide layer 5 is thickened, namely, an example in which the X-direction width of the light waveguide layer 5 becomes wider. The scattered-light generation pattern 7 of FIG. 9 can be achieved by changing the shape of the insulative film 11 for forming the scattered-light generation pattern 7 shown in FIG. 3H. Note that such a pattern in which a shape like the scattered-light generation pattern 7 in FIG. 9 is repeated, can also provide an effect similar to that by the scattered-light generation pattern 7 in FIG. 9, namely, can generate the scattered light.

Shown in FIG. 10 is another example of the scattered-light generation pattern 7. FIG. 10 corresponds to a main part in the Z-Y directional cross-section of the buried light waveguide 62 of Embodiment 1 (see, FIG. 2A). The scattered-light generation pattern 7 in Embodiment 1 was an example in which the Y-direction thickness of the light waveguide layer 5 is kept constant. The scattered-light generation pattern 7 in Embodiment 3 here is an example in which the film thickness of the light waveguide layer 5 is thinned, namely, an example in which the Y-direction thickness of the light waveguide layer 5 becomes thinner. The scattered-light generation pattern 7 shown in FIG. 10 has a constricted shape in which an upper portion (monitor PD 65-side) of the light waveguide layer 5 is shifted toward the InP substrate 1 to narrow that layer. Note that such a pattern in which a shape like the scattered-light generation pattern 7 in FIG. 10 is repeated, can also provide an effect similar to that by the scattered-light generation pattern 7 in FIG. 10, namely, can generate the scattered light.

The description has been made about the cases where the scattered-light generation patterns 7 shown in FIG. 9 and the scattered-light generation pattern 7 shown in FIG. 10 are applied to in the buried light waveguide 62 of Embodiment 1. However, these cases are not limitative, and the scattered-light generation pattern 7 shown in FIG. 9 and the scattered-light generation pattern 7 shown in FIG. 10 may be applied to in the high-mesa light waveguide 64 in Embodiment 2.

A manufacturing method of the semiconductor optical integrated device 200 of Embodiment 3 having the scattered-light generation pattern 7 of FIG. 9, is similar to the manufacturing method described in Embodiment 1. However, the shape of the insulative film 11 in FIG. 3H should be changed to be matched to the shape of the scattered-light generation pattern 7 of FIG. 9. Manufacturing methods of the semiconductor optical integrated device 200 of Embodiment 3 having the scattered-light generation pattern 7 of FIG. 10 will be described. A first manufacturing method results from addition of steps shown in FIG. 11A to FIG. 11E, between the step shown in FIG. 3D and the step shown in FIG. 3E according to Embodiment 1. A second manufacturing method results from addition of steps shown in FIG. 12A to FIG. 12D, between the step shown in FIG. 4B and the step shown in FIG. 4C according to Embodiment 1. FIG. 11A to FIG. 11E each show a cross-section of the optical-element-region mesa 56 along the Z-direction. FIG. 12A to FIG. 12D each show a cross-section of the optical-element-region mesa 56 along the Z-direction. First, the steps of FIG. 11A to FIG. 11E in the first manufacturing method will be described.

Figure 11A:
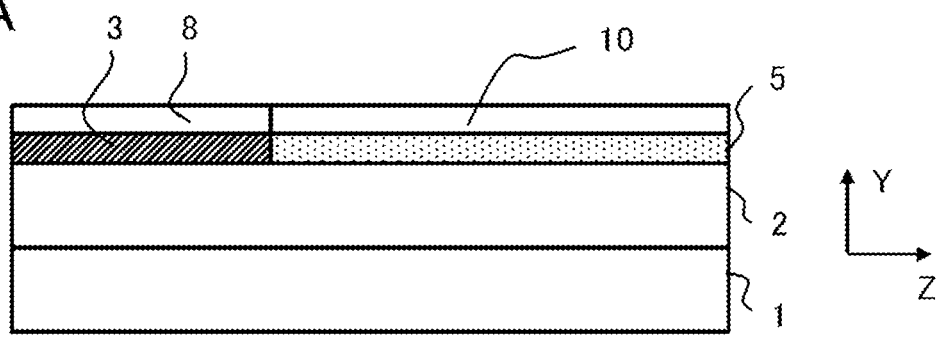
FIG. 11A is a diagram for illustrating a first manufacturing method in which the scattered-light generation pattern of FIG. 10 is formed.
Figure 11B:
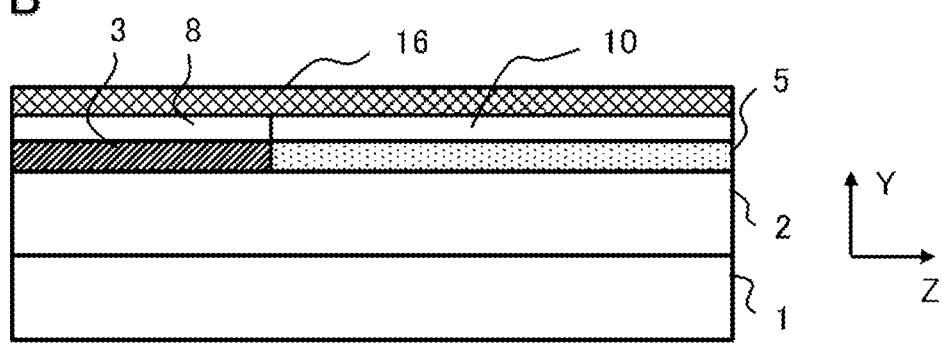
FIG. 11B is a diagram for illustrating the first manufacturing method in which the scattered-light generation pattern of FIG. 10 is formed.
Figure 11C:
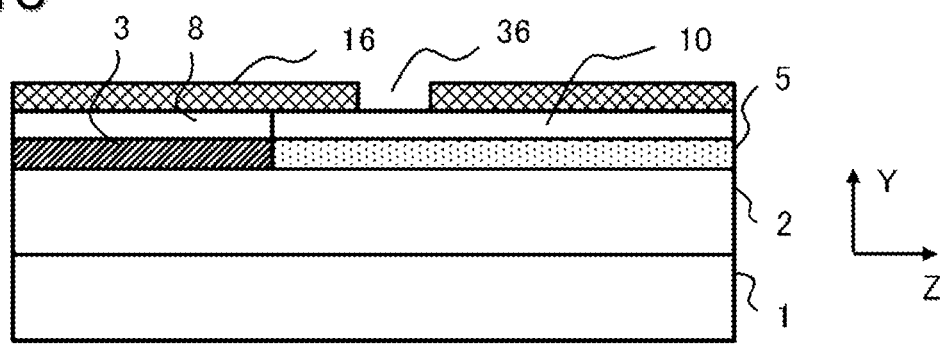
FIG. 11C is a diagram for illustrating the first manufacturing method in which the scattered-light generation pattern of FIG. 10 is formed.

As shown in FIG. 11A, the insulative film 9 in FIG. 3D is removed using hydrofluoric acid or the like. As shown in FIG. 11B, on the surfaces of the InP cladding layer 8 and the InP cladding layer 10 from which the insulative film 9 has been removed, an insulative film 16 of $SiO_2$ or the like is deposited. A photoresist is applied to the surface of the insulative film 16, and a part of the photoresist is opened by patterning. A general semiconductor photolithography step is employed therefor. Using the thus-patterned photoresist as a mask, the insulative film 16 is subjected to etching, to thereby create an insulative-film open portion 36 in the insulative film 16 as shown in FIG. 11C.

Figure 11D:
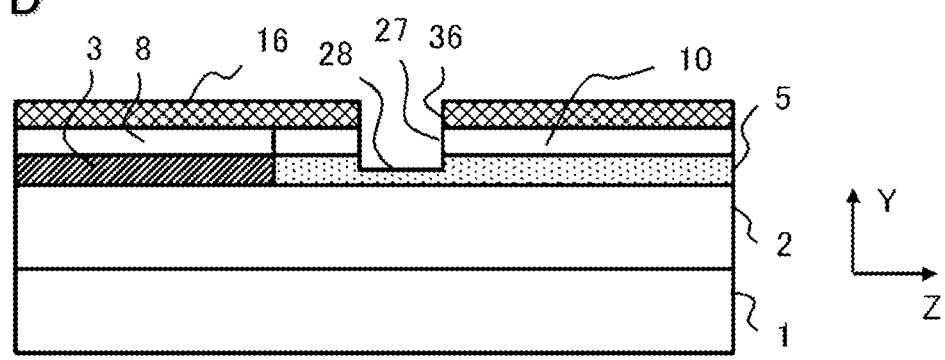
FIG. 11D is a diagram for illustrating the first manufacturing method in which the scattered-light generation pattern of FIG. 10 is formed.
Figure 11E:
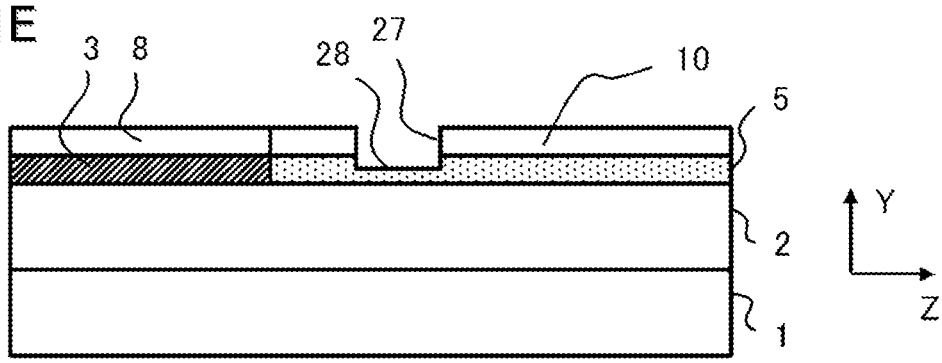
FIG. 11E is a diagram for illustrating the first manufacturing method in which the scattered-light generation pattern of FIG. 10 is formed.

As shown in FIG. 11D, using the patterned insulative film 16 as a mask, the InP cladding layer 10 and the light waveguide layer 5 are etched to be partly removed up to an intermediate depth of that light waveguide layer by employing dry etching or wet etching, to thereby create an InP-cladding-layer open portion 27 and a light-waveguide-layer depressed portion 28. In the wet etching, an etchant such as hydrochloric acid or the like is used for the InP cladding layer 10. An etchant such as hydrobromic acid, tartaric acid or the like is used for the light waveguide layer 5. In the dry etching, a methane-based gas, a chlorine-based gas, or the like is used. As shown in FIG. 11E, the insulative film 16 is removed by hydrofluoric acid or the like. Steps following that are the same as the steps shown in FIG. 3E and its following figures. However, the scattered-light-generation-pattern forming portion 23 in FIG. 3H is not required, so that a rectangular contour with no constricted shape is instead provided at the location corresponding to the scattered-light-generation-pattern forming portion 23. Further, in the case of getting a contour having both the Y-direction shape of the scattered-light generation pattern 7 in FIG. 10 and the X-direction shape of the scattered-light generation pattern 7 in FIG. 2B, it suffices to apply steps that are identical to the steps shown in FIG. 3E and its following figures. Note that, in FIG. 11D and FIG. 11E, the light-waveguide-layer depressed portion 28 is shown which has, as its bottom surface, a planar surface perpendicular to the Y-direction; however, if the wet etching has been used, a thickness of the light waveguide layer 5 at each of the Z-direction hedge portions of the light-waveguide-layer depressed portion 28 becomes thicker than that at the central portion thereof, so that the constricted shape as shown in FIG. 10 is formed.

Figure 12A:
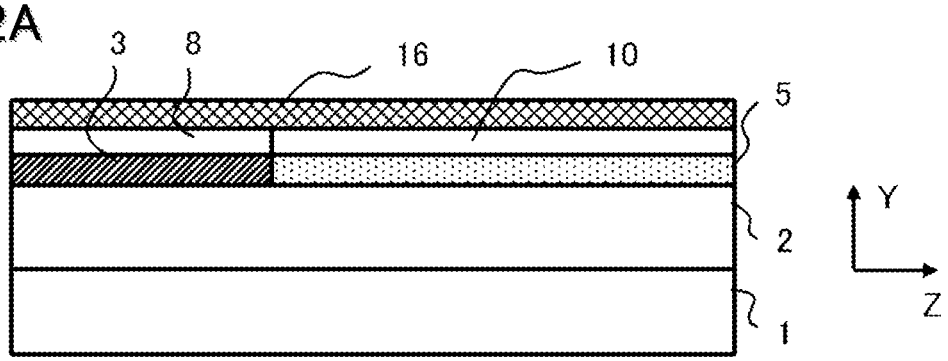
FIG. 12A is a diagram for illustrating a second manufacturing method in which the scattered-light generation pattern of FIG. 10 is formed.
Figure 12B:
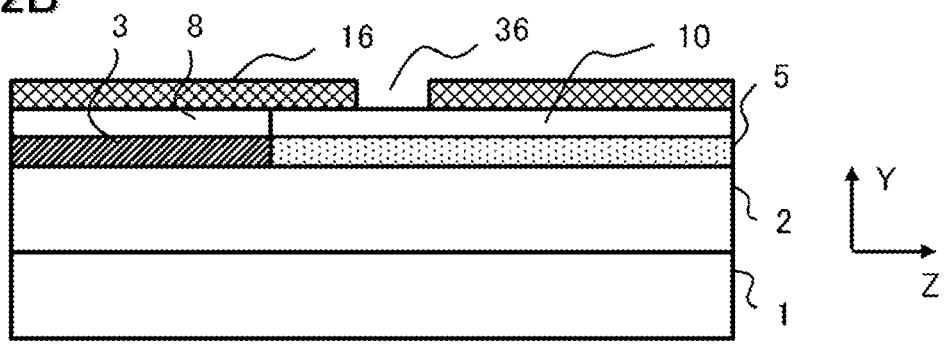
FIG. 12B is a diagram for illustrating the second manufacturing method in which the scattered-light generation pattern of FIG. 10 is formed.

The steps of FIG. 12A to FIG. 12D in the second manufacturing method will be described. Starting from the state shown in FIG. 4B in which the InP cladding layer 10 and the InP cladding layer 8 placed on the deeper side of the InP cladding layer 10 in the Z-direction are exposed, as shown in FIG. 12A, an insulative film 16 of $SiO_2$ or the like is deposited on the surfaces of the InP cladding layer 8 and the InP cladding layer 10 from which the insulative film 9 has been removed. A photoresist is applied to the surface of the insulative film 16, and a part of the photoresist is opened by patterning. A general semiconductor photolithography step is employed therefor. Using the thus-patterned photoresist as a mask, the insulative film 16 is subjected to etching, to thereby create an insulative-film open portion 36 in the insulative film 16 as shown in FIG. 12B.

Figure 12C:
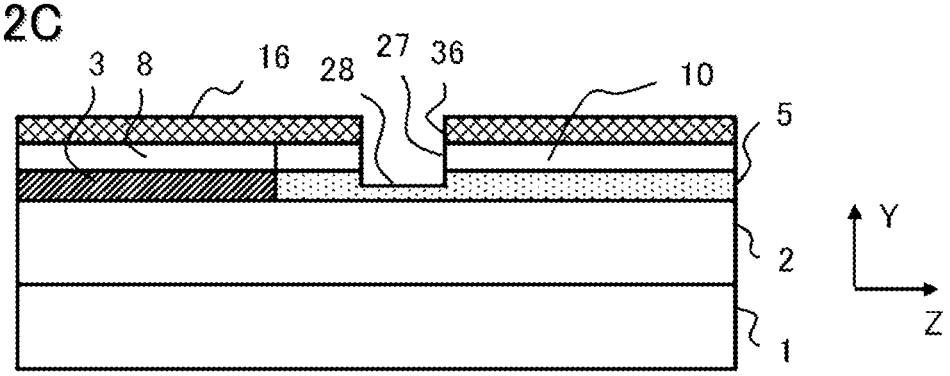
FIG. 12C is a diagram for illustrating the second manufacturing method in which the scattered-light generation pattern of FIG. 10 is formed.
Figure 12D:
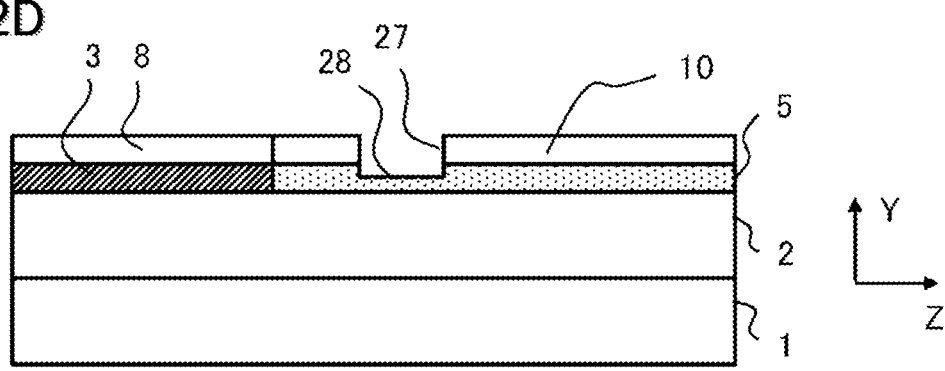
FIG. 12D is a diagram for illustrating the second manufacturing method in which the scattered-light generation pattern of FIG. 10 is formed.

As shown in FIG. 12C, using the patterned insulative film 16 as a mask, the InP cladding layer 10 and the light waveguide layer 5 are etched to be partly removed up to an intermediate depth of that light waveguide layer by employing dry etching or wet etching, to thereby create an InP-cladding-layer open portion 27 and a light-waveguide-layer depressed portion 28. In the wet etching, an etchant such as hydrochloric acid or the like is used for the InP cladding layer 10. An etchant such as hydrobromic acid, tartaric acid, or the like is used for the light waveguide layer 5. In the dry etching, a methane-based gas, a chlorine-based gas, or the like is used. As shown in FIG. 12D, the insulative film 16 is removed by hydrofluoric acid or the like. Steps following that are the same as the steps shown in FIG. 4C and its following figures. However, the scattered-light-generation-pattern forming portion 23 in FIG. 3H is not required, so that a rectangular contour with no constricted shape is instead provided at the location corresponding to the scattered-light-generation-pattern forming portion 23. Further, in the case of getting a contour having both the Y-direction shape of the scattered-light generation pattern 7 in FIG. 10 and the X-direction shape of the scattered-light generation pattern 7 in FIG. 2B, it suffices to apply steps that are the same as the steps represented by FIG. 3H so that the light-generation-pattern forming portion 23 in FIG. 3H is formed. Note that, in FIG. 12C and FIG. 12D, the light-waveguide-layer depressed portion 28 is shown which has, as its bottom surface, a planar surface perpendicular to the Y-direction; however, if the wet etching has been used, a thickness of the light waveguide layer 5 at each of the Z-direction hedge portions of the light-waveguide-layer depressed portion 28 becomes thicker than that at the central portion thereof, so that the constricted shape as shown in FIG. 10 is formed.

The semiconductor optical integrated device 200 of Embodiment 3 has the scattered-light generation pattern 7 shown in FIG. 9 or FIG. 10, so that, like in Embodiment 1 or Embodiment 2, it is possible to get scattered light by the scattered-light generation pattern 7, and to receive the scattered light by the monitor PD 65 to thereby obtain a monitoring current corresponding to the light intensity of the guided light. The semiconductor optical integrated device 200 of Embodiment 3 achieves functions and effects similar to those by the semiconductor optical integrated device 200 of Embodiment 1 or Embodiment 2. The semiconductor optical integrated device 200 of Embodiment 3 can monitor the intensity of the light propagating through the light waveguide (buried light waveguide 62, high-mesa light waveguide 64) without affecting the light distribution of that light and without deteriorating characteristics of the optical element on the light incident side.

Embodiment 4

Figure 13:
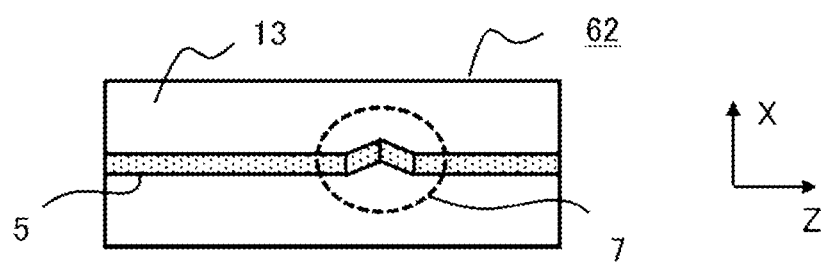
FIG. 13 is a diagram showing a scattered-light generation pattern according to Embodiment 4.

In Embodiment 4, a scattered-light generation pattern different to those in Embodiment 1 to Embodiment 3 will be described. FIG. 13 is a diagram showing the scattered-light generation pattern according to Embodiment 4. When a light waveguide layer 5 is bent intermediately, bending loss of the guided light will occur. Namely, due to the bent portion where the light waveguide layer 5 is bent intermediately, the loss of the guided light will occur. In Embodiment 4, scattered light generated due to the bending loss is received by the monitor PD 65. Shown in FIG. 13 is an example of the scattered-light generation pattern 7. FIG. 13 corresponds to a main part in the Z-X directional cross-section of the buried light waveguide 62 of Embodiment 1 (see, FIG. 2B). The scattered-light generation pattern 7 in Embodiment 1 was an example in which the X-direction width of the light waveguide layer 5 is narrowed. The scattered-light generation pattern 7 in Embodiment 4 is an example in which the light waveguide layer 5 is meandered. The scattered-light generation pattern 7 of FIG. 13 can be achieved by changing the shape of the insulative film for forming the scattered-light generation pattern 7 shown in FIG. 3⊔. Note that such a pattern in which a shape like the scattered-light generation pattern 7 in FIG. 13 is repeated, can also provide an effect similar to that by the scattered-light generation pattern 7 in FIG. 13, namely, can generate the scattered light. Note that the scattered-light generation pattern 7 shown in FIG. 13 may be applied to in the high-mesa light waveguide 64 in Embodiment 2.

The semiconductor optical integrated device 200 of Embodiment 4 has the scattered-light generation pattern 7 shown in FIG. 13, so that, like in Embodiment 1 or Embodiment 2, it is possible to get scattered light by the scattered-light generation pattern 7, and to receive the scattered light by the monitor PD 65 to thereby obtain a monitoring current corresponding to the light intensity of the guided light. The semiconductor optical integrated device 200 of Embodiment 4 achieves functions and effects similar to those by the semiconductor optical integrated device 200 of Embodiment 1 or Embodiment 2. The semiconductor optical integrated device 200 of Embodiment 4 can monitor the intensity of the light propagating through the light waveguide (buried light waveguide 62, high-mesa light waveguide 64) without affecting the light distribution of that light and without deteriorating characteristics of the optical element on the light incident side.

As described above, the semiconductor optical integrated device 200 of Embodiment 4 is a semiconductor optical integrated device in which the first optical element 61, the monitoring light waveguide (buried light waveguide 62, high-mesa light waveguide 64) and the second optical element 63, through which light propagates, are formed on a common semiconductor substrate (InP substrate 1), wherein the monitoring light waveguide (buried light waveguide 62, high-mesa light waveguide 64) is joined to the first optical element 61, and the second optical element 63 is joined to the monitoring light waveguide (buried light waveguide 62, high-mesa light waveguide 64). [Feature 1]

The monitoring light waveguide (buried light waveguide 62, high-mesa light waveguide 64) comprises a layered body which is formed on the semiconductor substrate (InP substrate 1) and in which the first cladding layer (InP cladding layer 2), the light waveguide layer 5 having a light scattering portion (scattered-light generation pattern 7) for scattering a part of the light, and the second cladding layer (InP cladding layer 4) are successively stacked, wherein the light scattering portion (scattered-light generation pattern 7) is a bent portion formed in the light waveguide layer 5; and a light detector (monitor PD 65) for receiving scattered light scattered by the light scattering portion (scattered-light generation pattern 7) is placed on an outer periphery of the monitoring light waveguide (buried light waveguide 62, high-mesa light waveguide 64), or on a back surface of the semiconductor substrate (InP substrate 1) on its side opposite to that facing the light scattering portion (scattered-light generation pattern 7). [Feature 2]

According to Feature 1 and Feature 2, in the semiconductor optical integrated device 200 of Embodiment 4, the light detector (monitor PD 65) for receiving scattered light scattered by the light scattering portion (scattered-light generation pattern 7) in the monitoring light waveguide (buried light waveguide 62, high-mesa light waveguide 64) for scattering a part of the light, is placed on an outer periphery of the monitoring light waveguide (buried light waveguide 62, high-mesa light waveguide 64), or on a back surface of the semiconductor substrate (InP substrate 1) on its side opposite to that facing the light scattering portion (scattered-light generation pattern 7). This makes it possible to monitor the intensity of the light propagating through the light waveguide (buried light waveguide 62, high-mesa light waveguide 64) without affecting the light distribution of that light and without deteriorating characteristics of the optical element on the light incident side.

Embodiment 5

Figure 14:
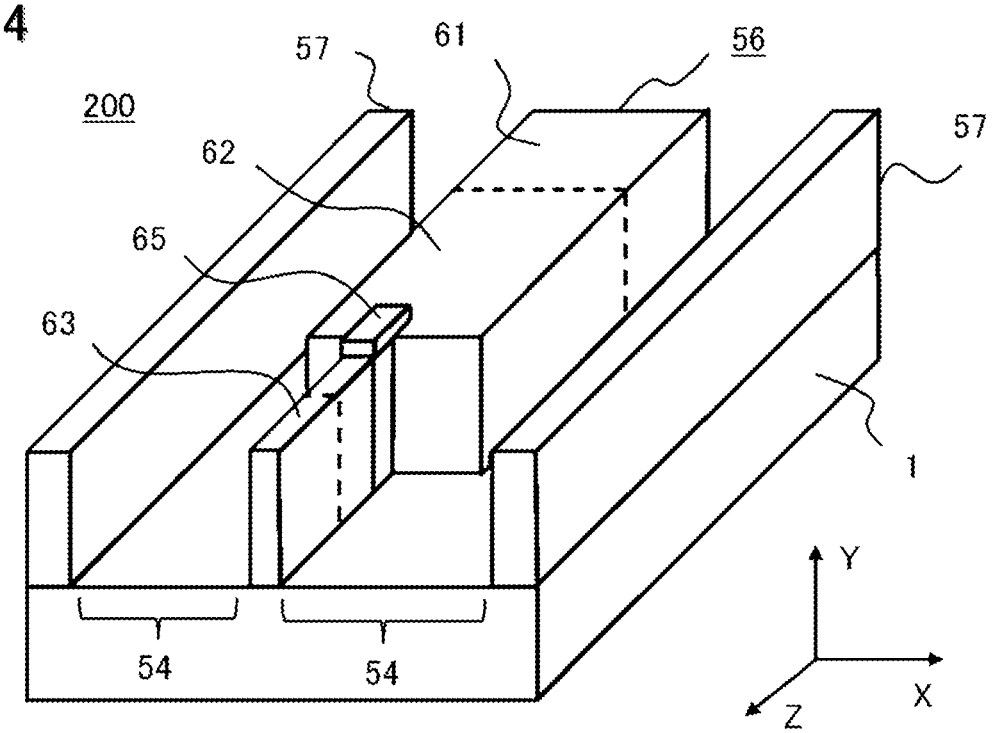
FIG. 14 is a bird's-eye view showing a semiconductor optical integrated device according to Embodiment 5.
Figure 15A:
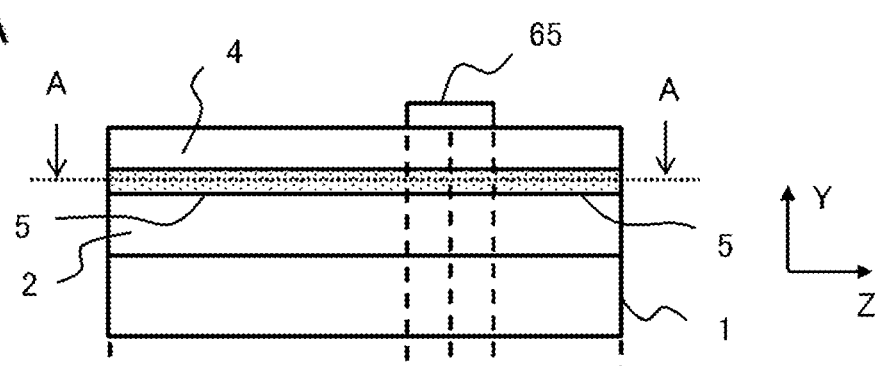
FIG. 15A is a sectional view of a main part of an optical-element-region mesa in FIG. 14, along the Z-direction.
Figure 15B:
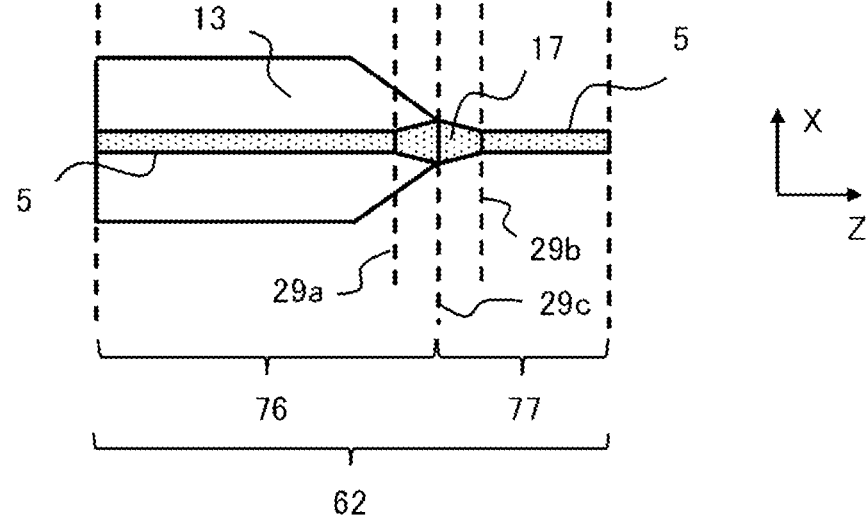
FIG. 15B is a sectional view on A-A in FIG. 15A.

In Embodiment 5, description will be made about a case where a mode-conversion light waveguide 17 is employed as a pattern for getting scattered light. FIG. 14 is a bird's-eye view showing a semiconductor optical integrated device according to Embodiment 5. FIG. 15A is a sectional view of a main part of an optical-element-region mesa in FIG. 14 along the Z-direction; and FIG. 15B is a sectional view on A-A in FIG. 15A. Embodiment 5 corresponds to the case where the mode-conversion light waveguide 17 is employed as a pattern for getting scattered light. A buried light waveguide 62 shown in FIG. 15 has a first light waveguide 76 and a second light waveguide 77, and a light waveguide layer 5 in the first light waveguide 76 and a light waveguide layer 5 in the second light waveguide 77 are joined to each other through the mode-conversion light waveguide 17. Although the mode-conversion light waveguide 17 is provided for coupling different light waveguide modes to each other, scattered light will be generated when the guided light is mode-converted. In the semiconductor optical integrated device 200 of Embodiment 5, a monitor PD 65 is placed on the upper side of the mode-conversion light waveguide 17. In FIG. 15, a case is shown where the mode-conversion light waveguide 17 is disposed between a broken line 29a and a broken line 29b. Further, in FIG. 15, a case is shown where the electric-current blocking layers 13 are placed on the left side of a broken line 29c while no electric-current blocking layer 13 is placed on the right side of the broken line 29c. Namely, in FIG. 15, such a case is shown where the first light waveguide 76 is a light waveguide having a buried structure and the second light waveguide 77 is a light waveguide having a high-mesa structure.

It is appropriate to place the monitor PD 65 on the upper side of the mode-conversion light waveguide 17, so as to be placed at a location where the monitor PD 65 can receive all the scattered light having reached the upper face (surface) of the InP cladding layer 4, said location being centered on a position where the intensity of scattered light becomes highest. Note that the position and the light receiving area of the monitor PD 65 may be adjusted according to a required monitoring-current value. The mode-conversion light waveguide 17, on the upper side of which the monitor PD 65 is placed, may have either a buried structure or a high-mesa structure. Further, the first light waveguide 76 and the second light waveguide 77 may each have a buried structure, and the first light waveguide 76 and the second light waveguide 77 may each have a high-mesa structure. Further, it is also allowed that a buried structure and a high-mesa structure are given to the second light waveguide 77 and the first light waveguide 76, respectively, and the monitor PD 65 is placed on the upper side of the mode-conversion light waveguide therebetween.

In the semiconductor optical integrated device 200 of Embodiment 5, the monitor PD 65 is placed on the upper side of the mode-conversion light waveguide 17 by which scattered light will be generated, so that, like in Embodiment 1 or Embodiment 2, it is possible to get scattered light by the mode-conversion light waveguide 17, and to receive the scattered light by the monitor PD 65 to thereby obtain a monitoring current corresponding to the light intensity of the guided light. The semiconductor optical integrated device 200 of Embodiment 5 achieves functions and effects similar to those by the semiconductor optical integrated device 200 of Embodiment 1 or Embodiment 2. The semiconductor optical integrated device 200 of Embodiment 5 can monitor the intensity of the light propagating through the light waveguide (buried light waveguide 62, high-mesa light waveguide 64) without affecting the light distribution of that light and without deteriorating characteristics of the optical element on the light incident side.

Embodiment 6

In Embodiment 6, description will be made about a case where such light waveguides that are joined to each other through a butt joint are employed for providing a scattered-light generation portion for getting scattered light. FIG. 16A is a sectional view of a main part of a monitoring light waveguide according to Embodiment 6, along the Z-direction; and FIG. 16B is a sectional view on A-A in FIG. 16A. FIG. 17A is a sectional view of a main part of another monitoring light waveguide according to Embodiment 6, along the Z-direction; and FIG. 17B is a sectional view on A-A in FIG. 17A. A buried light waveguide 62 as the monitoring light waveguide shown in FIG. 16A and FIG. 16B, has a first light waveguide 76 and a second light waveguide 77, and a light waveguide layer 18 in the first light waveguide 76 and a light waveguide layer 5 in the second light waveguide 77 are joined to each other through a butt joint, and thus have a butt joint portion 37. A semiconductor optical integrated device 200 of Embodiment 6 results from applying the buried light waveguide 62 shown in FIG. 16A and FIG. 16B to the semiconductor optical integrated device 200 of Embodiment 1. In FIG. 16A, a Y-direction first light distribution 21 and a Y-direction second light distribution 22 are shown that are light distributions along the Y-direction at the first light waveguide 76 and the second light waveguide 77, respectively. Further, in FIG. 16B, an X-direction first light distribution 19 and an X-direction second light distribution 20 are shown that are light distributions along the X-direction at the first light waveguide 76 and the second light waveguide 77, respectively.

It is now defined that the mode field diameter of the first light waveguide 76 along the X-direction is w1$x$ and the mode field diameter thereof along the Y-direction is w1$y$; and the mode field diameter of the second light waveguide 77 along the X-direction is w2$x$ and the mode field diameter thereof along the Y-direction is w2$y$. The light waveguides joined to each other through a butt joint that serves as a scattered-light generation portion in Embodiment 6, are defined as follows: in either case where the mode field diameter at the first light waveguide 76 and the mode filed diameter at the second light waveguide 77 are the same or different to each other, a set of such light waveguides in which an amount of displacement in the X-direction between the mode field center of the first light waveguide 76 and the mode field center of the second light waveguide is in a range (Range 1) from −(w1$x$+w2$x$)/2 to +(w1$x$+w2$x$)/2, and an amount of displacement in the Y-direction (width direction) therebetween is in a range (Range 2) from −(w1$y$+w2$y$)/2 to +(w1$y$+w2$y$)/2. Note that, when the mode field diameters at the first light waveguide 76 and the second light waveguide 77 are the same, the amount of the displacement has to be in a range except for zero point in each of Range 1 and Range 2 (except for the case where their centers coincide with each other). When a displacement between the mode filed diameters at these two light waveguides occurs beyond that range, or when the amount of displacement is zero, an amount of guided light coupled to the second light waveguide 77 becomes 10% of the guided light in the first light waveguide 76, or no scattered light is generated, so that the product can't stand practical use as an optical semiconductor device. Note that how to calculate the coupling efficiency of that light is described in pages 29 to 45 of the Document "Foundation and Application of Optical Coupling System for Optical Device" by Kenji Kawano, 2nd edition, Japan.

A high-mesa light waveguide 64 as the monitoring light waveguide shown in FIG. 17A or FIG. 17B, has a first light waveguide 76 and a second light waveguide 77, and a light waveguide layer 18 in the first light waveguide 76 and a light waveguide layer 5 in the second light waveguide 77 are joined to each other through a butt joint, and thus have a butt joint portion 37. Another semiconductor optical integrated device 200 of Embodiment 6 results from applying the high-mesa light waveguide 64 shown in FIG. 17A and FIG. 17B to the semiconductor optical integrated device 200 of Embodiment 2. In FIG. 17A, a Y-direction first light distribution 21 and a Y-direction second light distribution 22 are shown that are light distributions along the Y-direction at the first light waveguide 76 and the second light waveguide 77, respectively. Further, in FIG. 17B, an X-direction first light distribution 19 and an X-direction second light distribution 20 are shown that are light distributions along the X-direction at the first light waveguide 76 and the second light waveguide 77, respectively. The high-mesa light waveguide 64 shown in FIG. 17A and FIG. 17B can also generate scattered light like the buried light waveguide 62 shown in FIG. 16A and FIG. 16B.

The buried light waveguide 62 shown in FIG. 16A and FIG. 16B comprises the light waveguides joined to each other through the butt joint portion 37 that serves as a scattered-light generation portion. Further, the high-mesa light waveguide 64 shown in FIG. 17A and FIG. 17B comprises the light waveguides joined to each other through the butt joint portion 37 that serves as a scattered-light generation portion. In either case of the buried light waveguide 62 or the high-mesa light waveguide 64, it is appropriate to place the monitor PD 65 on the upper side of the butt joint portion 37, so as to be placed at a location where the monitor PD 65 can receive all the scattered light having reached the upper face (surface) of the InP cladding layer 4, said location being centered on a position where the intensity of scattered light from the butt joint portion 37 becomes highest. Note that the position and the light receiving area of the monitor PD 65 may be adjusted according to a required monitoring-current value.

It is noted that, in FIG. 16A and FIG. 16B, an example of the buried light waveguide 62 is shown that comprises the first light waveguide 76 and the second light waveguide 77. However, the light waveguide layer 18 in the first light waveguide 76 may instead be an active layer 3 in the first optical element 61. This is because the first optical element 61, namely, the semiconductor laser, also functions as a light waveguide. Accordingly, the butt joint portion 37 may instead be formed around a joined portion between the active layer 3 in the first optical element 61 and the light waveguide layer 5 in the buried light waveguide 62. In FIG. 17A and FIG. 17B, an example of the high-mesa light waveguide 64 is shown that comprises the first light waveguide 76 and the second light waveguide 77; however, the butt joint portion 37 may instead be formed around a joined portion between the active layer 3 in the first optical element 61 and the light waveguide layer 5 in the high-mesa light waveguide 64.

In the semiconductor optical integrated device 200 of Embodiment 6, the monitor PD 65 is placed on the upper side of the butt joint portion 37 by which scattered light will be generated, so that, like in Embodiment 1 or Embodiment 2, it is possible to get scattered light by the butt joint portion 37, and to receive the scattered light by the monitor PD 65 to thereby obtain a monitoring current corresponding to the light intensity of the guided light. The semiconductor optical integrated device 200 of Embodiment 6 achieves functions and effects similar to those by the semiconductor optical integrated device 200 of Embodiment 1 or Embodiment 2. The semiconductor optical integrated device 200 of Embodiment 6 can monitor the intensity of the light propagating through the light waveguide (buried light waveguide 62, high-mesa light waveguide 64) without affecting the light distribution of that light and without deteriorating characteristics of the optical element on the light incident side.

Embodiment 7

FIG. 18 is a bird's-eye view showing a semiconductor optical integrated device according to Embodiment 7. A semiconductor optical integrated device 200 shown in FIG. 18 differs from the semiconductor optical integrated device 200 of Embodiment 1 in that the monitor PD 65 placed on the upper side of the light waveguide is changed to a monitor PD 66 monolithically integrated by a crystal growth technique such as an MOCVD or the like. The monitor PD 66 monolithically integrated by a crystal growth technique such as an MOCVD or the like, may be applied to Embodiment 2 to Embodiment 6.

The semiconductor optical integrated device 200 of Embodiment 7 achieves functions and effects similar to those by the semiconductor optical integrated device 200 of each of Embodiment 1 to Embodiment 6. Using the monolithically-integrated monitor PD 66, the semiconductor optical integrated device 200 of Embodiment 7 can monitor the intensity of the light propagating through the light waveguide (buried light waveguide 62, high-mesa light waveguide 64) without affecting the light distribution of that light and without deteriorating characteristics of the optical element on the light incident side.

Embodiment 8

Figure 19:
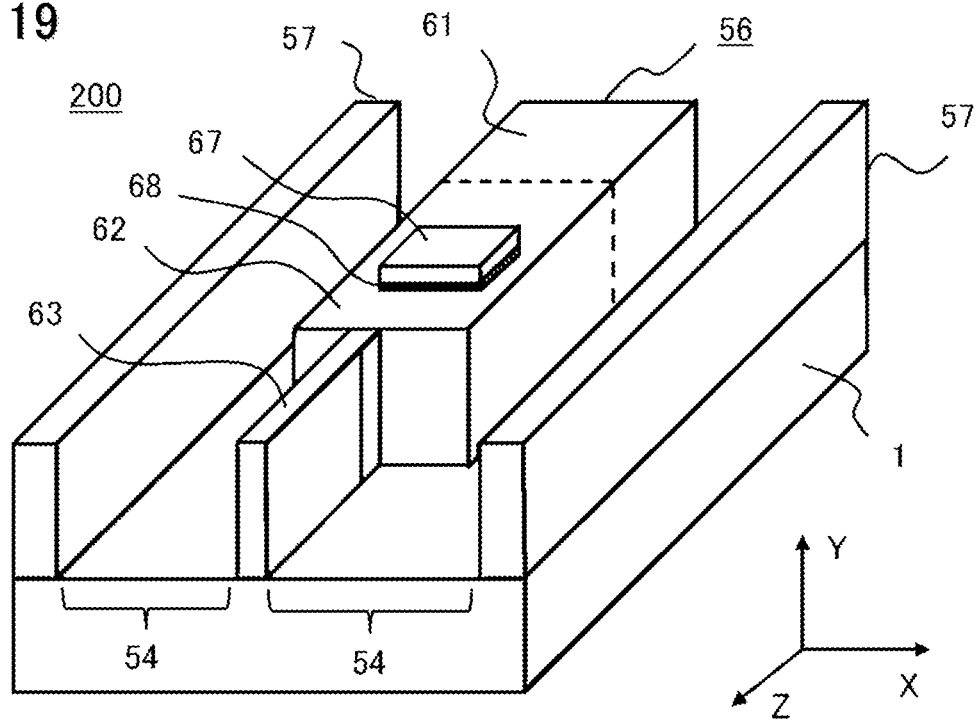
FIG. 19 is a bird's-eye view showing a semiconductor optical integrated device according to Embodiment 8.

FIG. 19 is a bird's-eye view showing a semiconductor optical integrated device according to Embodiment 8. A semiconductor optical integrated device 200 shown in FIG. 19 differs from the semiconductor optical integrated device 200 of Embodiment 1 in that the monitor PD 65 placed on the upper side of the light waveguide is changed to a monitor-PD element 67 adhered by an adhesive agent 68 to that side. The adhesive agent 68 is, for example, an organic adhesive agent of polyimide or the like. How to adhere the monitor-PD element 67 is herein exemplified by a method of using the adhesive agent 68; however, another method may be employed.

The semiconductor optical integrated device 200 of Embodiment 8 achieves functions and effects similar to those by the semiconductor optical integrated device 200 of each of Embodiment 1 to Embodiment 6. Using the thus-adhered monitor-PD element 67, the semiconductor optical integrated device 200 of Embodiment 8 can monitor the intensity of the light propagating through the light waveguide (buried light waveguide 62, high-mesa light waveguide 64) without affecting the light distribution of that light and without deteriorating characteristics of the optical element on the light incident side.

Embodiment 9

Figure 20:
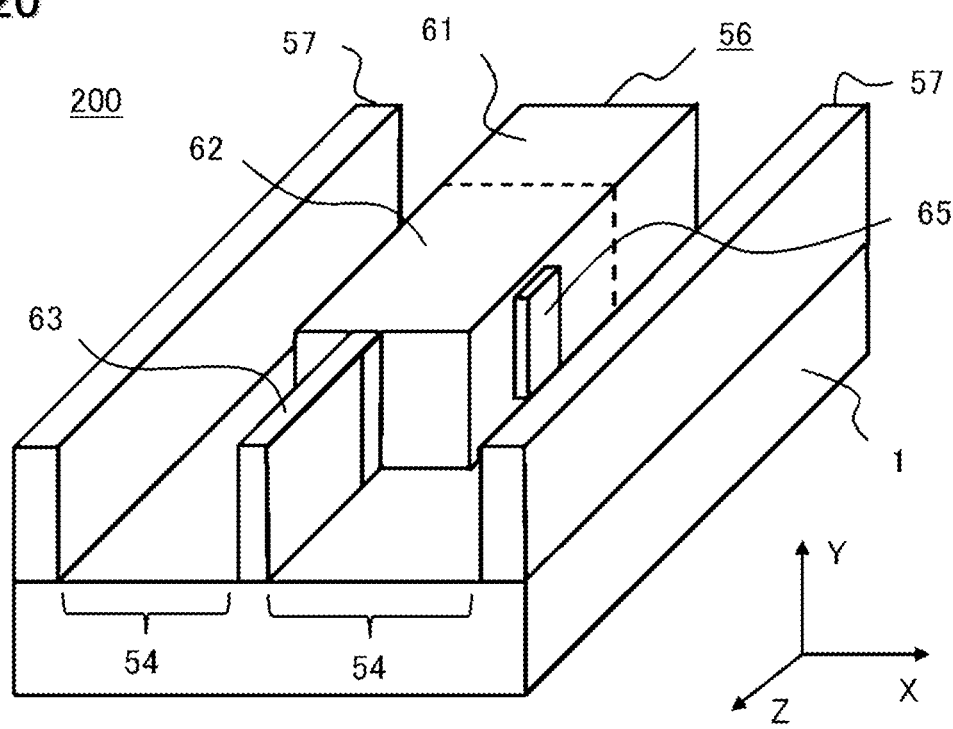
FIG. 20 is a bird's-eye view showing a semiconductor optical integrated device according to Embodiment 9.

FIG. 20 is a bird's-eye view showing a semiconductor optical integrated device according to Embodiment 9. FIG. 21A is a sectional view of an optical-element-region mesa in FIG. 20, along the Z-direction; and FIG. 21B is a sectional view on A-A in FIG. 21A. A semiconductor optical integrated device 200 of Embodiment 9 differs from the semiconductor optical integrated device 200 of Embodiment 1 in that the monitor PD 65 placed on the upper side of the light waveguide in the optical-element-region mesa 56, is adhesively placed, instead, on one of side surfaces of the light waveguide (buried light waveguide 62) in the optical-element-region mesa 56, or on each of that side surfaces. In FIG. 21B, a case is shown where the monitor PD 65 is placed on each of the side surfaces of the light waveguide in the optical-element-region mesa 56. A specific example of the monitor PD 65 shown in FIG. 20 and FIG. 21B is the monitor-PD element 67 shown in Embodiment 8 that is adhered by the adhesive agent 68.

With respect to the placement position of the monitor PD 65, as shown in FIG. 21B, it is appropriate to place the monitor PD 65 so as to be displaced in the guided direction relative to the scattered-light generation pattern 7 for generating scattered light, and so as to be placed at a location where the monitor PD 65 can receive all the scattered light having reached the mesa side surface, said location being centered on a position where the light intensity of the scattered light becomes highest. Note that the position and the light receiving area of the monitor PD 65 may be adjusted according to a required monitoring-current value.

In the light waveguide that generates scattered light, the scattered light is scattered isotropically in the light traveling direction in that waveguide from the scattered-light generation pattern 7. Thus, even when the monitor PD 65 is placed on the side surface of the light waveguide in the optical-element-region mesa 56, it is possible, like in Embodiment 1, to get scattered light by the scattered-light generation pattern 7 and to receive the scattered light by the monitor PD 65 to thereby obtain a monitoring current corresponding to the light intensity of the guided light. The monitor PD 65 in a state placed on the side surface of the light waveguide in the optical-element-region mesa 56 may be applied to Embodiment 2 to Embodiment 6. A scattered light generating portion corresponds to the scattered-light generation pattern 7, the mode-conversion light waveguide 17 or the butt joint portion 37. When the scattered light generating portion is the mode-conversion light waveguide 17, the monitor PD 65 is placed so as to straddle between the monitoring light waveguide (buried light waveguide 62, high-mesa light waveguide 64) and the second optical element 63. Note that even if it is the butt joint portion 37 displaced in the X-direction as shown in FIG. 17B of Embodiment 6, such a portion is applicable here by adjusting the thickness of the adhesive agent 68 described in Embodiment 8.

The semiconductor optical integrated device 200 of Embodiment 9 achieves functions and effects similar to those by the semiconductor optical integrated device 200 of each of Embodiment 1 to Embodiment 6. Using the monitor PD 65 placed on the side surface of the light waveguide in the optical-element-region mesa 56, the semiconductor optical integrated device 200 of Embodiment 9 can monitor the intensity of the light propagating through the light waveguide (buried light waveguide 62, high-mesa light waveguide 64) without affecting the light distribution of that light and without deteriorating characteristics of the optical element on the light incident side.

Embodiment 10

FIG. 22 is a bird's-eye view showing a semiconductor optical integrated device according to Embodiment 10. FIG. 23A is a sectional view of an optical-element-region mesa in FIG. 22, along the Z-direction; and FIG. 23B is a sectional view on A-A in FIG. 23A. A semiconductor optical integrated device 200 of Embodiment 10 differs from the semiconductor optical integrated device 200 of Embodiment 1 in that the monitor PD 65 placed on the upper side of the light waveguide in the optical-element-region mesa 56, is adhesively placed, instead, on a back surface of the InP substrate 1. A specific example of the monitor PD 65 shown in FIG. 22 and FIG. 23A is the monitor-PD element 67 shown in Embodiment 8 that is adhered by the adhesive agent 68.

With respect to the placement position of the monitor PD 65, as shown in FIG. 23A and FIG. 23B, it is appropriate to place the monitor PD 65 so as to be displaced in the guided direction relative to the scattered-light generation pattern 7 for generating scattered light, and so as to be placed at a location where the monitor PD 65 can receive all the scattered light having reached the back surface of the InP substrate 1, said location being centered on a position where the light intensity of the scattered light becomes highest. Note that the position and the light receiving area of the monitor PD 65 may be adjusted according to a required monitoring-current value.

Scattered light due to scattering by the scattered-light generation pattern 7 will propagate in the InP substrate 1 to reach the back surface of the InP substrate 1. The scattered light can be received by the monitor PD 65 adhesively placed on the back surface. Thus, even when the monitor PD 65 is placed on the back surface of the InP substrate 1, it is possible, like in Embodiment 1, to get scattered light by the scattered-light generation pattern 7 and to receive the scattered light by the monitor PD 65 to thereby obtain a monitoring current corresponding to the light intensity of the guided light. The monitor PD 65 in a state placed on the back surface of the InP substrate 1 may be applied to Embodiment 2 to Embodiment 6. A scattered light generating portion corresponds to the scattered-light generation pattern 7, the mode-conversion light waveguide 17 or the butt joint portion 37.

The semiconductor optical integrated device 200 of Embodiment 10 achieves functions and effects similar to those by the semiconductor optical integrated device 200 of each of Embodiment 1 to Embodiment 6. Using the monitor PD 65 placed on the back surface of the InP substrate 1, the semiconductor optical integrated device 200 of Embodiment 10 can monitor the intensity of the light propagating through the light waveguide (buried light waveguide 62, high-mesa light waveguide 64) without affecting the light distribution of that light and without deteriorating characteristics of the optical element on the light incident side.

Embodiment 11

In Embodiment 11, description will be made about the shape of a mesa side surface for generating scattered light. FIG. 24A is a sectional view of a main part of a monitoring light waveguide according to Embodiment 11, along the Z-direction, and FIG. 24B is a sectional view on A-A in FIG. 24A. A semiconductor optical integrated device 200 of Embodiment 11 results from changing the scattered-light generation pattern in the semiconductor optical integrated device 200 of Embodiment 1, to concave portions 32 shown in FIG. 24A and FIG. 24B. The concave portions 32 are formed at the time the optical-element-region mesa 56 is formed, more specifically, at the same time when the mesa grooves 54 are created. The depth of each concave portion 32 in the X-direction is adjusted so that the concave portion can overlap with the distribution of internally guided light (light distribution 31). When a tail of the guided light is caught in the thus-processed concave portion 32, scattered light is generated. In the semiconductor optical integrated device 200 of Embodiment 11, the monitor PD 65 receives the scattered light generated by the concave portions 32. Note that, in FIG. 24A and FIG. 24B, the concave portions 32 each having a triangle-prism shape are shown. In the concave portion 32 having a triangle-prism shape, the X-Z directional cross-section (cross-section perpendicular to the Y-direction) is triangle.

It is appropriate that the monitor PD 65 shown in FIG. 24A is placed on the upper side of a concave-portion connection line 38 connecting between the concave portions 32 formed on both mesa side surfaces, so as to be placed at a location where the monitor PD 65 can receive all the scattered light having reached the upper face (surface) of the InP cladding layer 4, said location being centered on a position where the light intensity of the scattered light becomes highest. Note that the position and the light receiving area of the monitor PD 65 may be adjusted according to a required monitoring-current value. Further, in FIG. 24A and FIG. 24B, a case is shown where the monitor PD 65 is placed on the upper side of the buried light waveguide 62 as the monitoring light waveguide; however, the monitor PD 65 may instead be placed on a mesa side surface(s) as shown in Embodiment 9 or on a back surface of the InP substrate 1 as shown in Embodiment 10. When the monitor PD 65 is to be placed on the mesa side surface or the back surface of the InP substrate 1, it is appropriate to place the monitor PD 65 so as to be displaced in the guided direction with reference to the concave-portion connection line 38, and so as to be placed at a location where the monitor PD 65 can receive all the scattered light having reached the mesa side surface or the back surface of the InP substrate 1, said location being centered on a position where the light intensity of the scattered light becomes highest. Note that the position and the light receiving area of the monitor PD 65 may be adjusted according to a required monitoring-current value.

The semiconductor optical integrated device 200 of Embodiment 11 has the concave portions 32 shown in FIG. 24A and FIG. 24B by which scattered light will be generated, so that, like in Embodiment 1, it is possible to get scattered light by the concave portions 32, and to receive the scattered light by the monitor PD 65 to thereby obtain a monitoring current corresponding to the light intensity of the guided light. The semiconductor optical integrated device 200 of Embodiment 11 achieves functions and effects similar to those by the semiconductor optical integrated device 200 of Embodiment 1. The semiconductor optical integrated device 200 of Embodiment 11 can monitor the intensity of the light propagating through the light waveguide (buried light waveguide 62) without affecting the light distribution of that light and without deteriorating characteristics of the optical element on the light incident side.

As described above, the semiconductor optical integrated device 200 of Embodiment 11 is a semiconductor optical integrated device in which the first optical element 61, the monitoring light waveguide (buried light waveguide 62) and the second optical element 63, through which light propagates, are formed on a common semiconductor substrate (InP substrate 1), wherein the monitoring light waveguide (buried light waveguide 62) is joined to the first optical element 61, and the second optical element 63 is joined to the monitoring light waveguide (buried light waveguide 62).[Feature 1]

The monitoring light waveguide (buried light waveguide 62) comprises a layered body which is formed on the semiconductor substrate (InP substrate 1) and in which a first cladding layer (InP cladding layer 2), the light waveguide layer 5 and a second cladding layer (InP cladding layer 4) are successively stacked, wherein the layered body has a buried structure provided with a pair of mesa facets which are opposite to each other in the X-direction perpendicular both to the Y-direction that is perpendicular to the semiconductor substrate (InP substrate 1), and to the Z-direction that is the propagating direction of the light, and on which the light waveguide layer 5 is not exposed.[Feature 2]

The monitoring light waveguide (buried light waveguide 62) has, on at least one of the mesa facets across the X-direction, the concave portion 32 with which a distribution of the light overlaps, wherein the concave portion 32 serves as a light scattering portion for scattering a part of the light; and the light detector 65 for receiving scattered light scattered by the light scattering portion (concave portion 32), is placed on an outer periphery of the monitoring light waveguide (buried light waveguide 62), or on a back surface of the semiconductor substrate (InP substrate 1) on its side opposite to that facing the light scattering portion (concave portion 32).[Feature 3]

According to Feature 1 to Feature 3, in the semiconductor optical integrated device 200 of Embodiment 11, the light detector (monitor PD 65) for receiving scattered light scattered by the light scattering portion (concave portion 32) in the monitoring light waveguide (buried light waveguide 62) for scattering a part of the light, is placed on an outer periphery of the monitoring light waveguide (buried light waveguide 62), or on a back surface of the semiconductor substrate (InP substrate 1) on its side opposite to that facing the light scattering portion (concave portion 32). This makes it possible to monitor the intensity of the light propagating through the light waveguide (buried light waveguide 62) without affecting the light distribution of that light and without deteriorating characteristics of the optical element on the light incident side.

Embodiment 12

In Embodiment 12, description will be made about a case where a concave-convex portion 33 is formed on a mesa side surface in order to prevent the scattered light from returning to the input side. FIG. 25A is a sectional view of an optical-element-region mesa in a semiconductor optical integrated device according to Embodiment 12, along the Z-direction; and FIG. 25B is a sectional view on A-A in FIG. 25A. A semiconductor optical integrated device 200 of Embodiment 12 results from forming the concave-convex portion 33 on each of the mesa side surfaces of the buried light waveguide 62 in the semiconductor optical integrated device 200 of Embodiment 1.

The concave-convex portion 33 is so designed that it is sufficiently away from the light distribution of the guided light and thus it does not affect the guided light. The scattered light will be reflected off or will transmit through the concave-convex portion 33 formed on the mesa side surface, in more various directions, so that it is prevented from returning to the scattered-light input side. Accordingly, the concave-convex portion 33 formed on the mesa side surface is provided for preventing the scattered light generated by the scattered-light generation pattern 7 from returning to the LD, namely, the first optical element 61.

According to the semiconductor optical integrated device 200 of Embodiment 12, because of the concave-convex portion 33, the scattered light generated by the scattered-light generation pattern 7 will be reflected off or will transmit through that portion in various directions. Thus, it is possible to reduce the amount of the return light toward the guided-light input side, for example, toward the LD.

In FIG. 25A and FIG. 25B, a case is shown where the scattered light generating portion is the scattered-light generation pattern 7 in Embodiment 1. However, the scattered light generating portion may be the scattered-light generation pattern 7 in Embodiment 3, the scattered-light generation pattern 7 in Embodiment 4, the mode-conversion light waveguide 17 in Embodiment 5 or the butt joint portion 37 in Embodiment 6. The monitor PD 65 may be placed on a back surface of the InP substrate 1 as described in Embodiment 10.

The semiconductor optical integrated device 200 of Embodiment 12 achieves functions and effects similar to those by the semiconductor optical integrated device 200 of Embodiment 1. The semiconductor optical integrated device 200 of Embodiment 12 can monitor the intensity of the light propagating through the light waveguide (buried light waveguide 62) without affecting the light distribution of that light and without deteriorating characteristics of the optical element on the light incident side. Furthermore, the semiconductor optical integrated device 200 of Embodiment 12 has the concave-convex portion 33 where the scattered light generated by the scattered light generating portion, such as the scattered-light generation pattern 7 or the like, will be reflected off or will transmit through in various directions, so that it is possible to reduce the amount of the return light toward the guided-light input side, namely, toward the first optical element 61.

Embodiment 13

In Embodiment 13, description will be made about a case where an absorption layer 34 having a large absorption coefficient is provided on the lower side of the light waveguide layer 5 in order to restrain scattered light from returning to the input side. FIG. 26 is a sectional view of an optical-element-region mesa in a semiconductor optical integrated device according to Embodiment 13, along the Z-direction. A semiconductor optical integrated device 200 of Embodiment 13 results from providing the absorption layer 34 having a large absorption coefficient, on the lower side of the light waveguide layer 5 in the semiconductor optical integrated device 200 of Embodiment 1. In order to restrain the scattered light generated by the scattered-light generation pattern 7 (see, FIG. 2B), the absorption layer 34 that is an InGaAs layer having a large absorption coefficient, is inserted on the lower side of the light waveguide layer 5. In FIG. 26, such a case is shown where the absorption layer 34 is inserted on the lower side of the active layer 3 in the first optical element 61. Further, in FIG. 26, such a case is shown where another absorption layer 34 is also placed on the surface of the InP cladding layer 4 at a downstream side, in the guided direction (Z-direction), of the location where the monitor PD 65 is placed. These absorption layers 34 are achieved using an MOCVD-based crystal growth technique. The absorption layer 34 may be made of a material other than InGaAs if the material has an absorption coefficient with respect to the wavelength of the guided light.

The InGaAs layer absorbs 1.3 µm-band and 1.5 µm-band light, and thus absorbs components of scattered light that was generated at the scattered-light generation pattern 7 for generating scattered light but has not reached the monitor PD 65, to thereby reduce the return light toward the input side. The absorption layer 34 on the lower side of the light waveguide layer 5 absorbs scattered light having propagated to the InP substrate 1-side, while the absorption layer 34 placed on the surface of the InP cladding layer 4 absorbs scattered light having propagated to the InP cladding layer 4-side. The semiconductor optical integrated device 200 of Embodiment 13 includes the absorption layer 34 at least on the lower side of the light waveguide layer 5. This makes it possible to remove components of the scattered light not incident on the monitor PD 65, to thereby reduce influence of the return light (amount of the return light) toward the input side. The semiconductor optical integrated device 200 of Embodiment 13 includes the absorption layers 34 on the lower side of the light waveguide layer 5 and on the surface of the InP cladding layer 4 at a downstream side, in the guided direction (Z-direction), of the monitor PD 65. This makes it possible to remove more components of the scattered light not incident on the monitor PD 65 than in the case where the absorption layer 34 is placed only on the lower side of the light waveguide layer 5, to thereby reduce influence of the return light toward the input side, to more extent.

The scattered light generating portion is not limited to the scattered-light generation pattern 7 in Embodiment 1, and may be the scattered-light generation pattern 7 in Embodiment 3, the scattered-light generation pattern 7 in Embodiment 4, the mode-conversion light waveguide 17 in Embodiment 5 or the butt joint portion 37 in Embodiment 6.

The semiconductor optical integrated device 200 of Embodiment 13 achieves functions and effects similar to those by the semiconductor optical integrated device 200 of Embodiment 1. The semiconductor optical integrated device 200 of Embodiment 13 can monitor the intensity of the light propagating through the light waveguide (buried light waveguide 62) without affecting the light distribution of that light and without deteriorating characteristics of the optical element on the light incident side. Furthermore, the semiconductor optical integrated device 200 of Embodiment 13 has the absorption layer 34 for absorbing scattered light generated by the scattered light generating portion, such as the scattered-light generation pattern 7 or the like, so that it is possible to reduce influence of the return light (amount of the return light) toward the guided-light input side, namely, toward the first optical element 61.

It should be noted that unlimited combination of the respective embodiments and any appropriate modification and omission in the embodiments may be made in the present invention to the extent without causing contradiction.

DESCRIPTION OF REFERENCE NUMERALS AND SIGNS

1: InP substrate (semiconductor substrate), 2: InP cladding layer (first cladding layer), 4: InP cladding layer (second cladding layer), 7: scattered-light generation pattern (light scattering portion), 17: mode-conversion light waveguide, 32: concave portion (light scattering portion), 33: concave-convex portion, 34: absorption layer, 37: butt joint portion, 61: first optical element, 62: buried light waveguide (monitoring light waveguide), 63: second optical element (high-mesa light waveguide), 64: high-mesa light waveguide (monitoring light waveguide), 65: monitor PD, 66: monitor PD, 67: monitor-PD element, 68: adhesive agent, 76: first light waveguide, 77: second light waveguide, 200: semiconductor optical integrated device, w1, w2, w1x, w2x, w1y, w2y: mode field diameter.

The invention claimed is:

1. A semiconductor optical integrated device in which a first optical element, a monitoring light waveguide and a second optical element, through which light propagates, are formed on a common semiconductor substrate;
    wherein the monitoring light waveguide is joined to the first optical element, and the second optical element is joined to the monitoring light waveguide;
    wherein the monitoring light waveguide comprises a layered body which is formed on the semiconductor substrate and in which a first cladding layer, a light waveguide layer having a light scattering portion for scattering a part of the light, and a second cladding layer, are successively stacked;
    wherein the layered body has:
    a high-mesa structure provided with a pair of mesa facets which are opposite to each other in an X-direction perpendicular both to a Y-direction that is perpendicular to the semiconductor substrate, and to a Z-direction that is a propagating direction of the light, and on which the light waveguide layer is exposed; or
    a buried structure provided with a pair of mesa facets which are opposite to each other in the X-direction perpendicular both to the Y-direction that is perpendicular to the semiconductor substrate, and to the Z-direction that is the propagating direction of the light, and on which the light waveguide layer is not exposed;
    wherein the light scattering portion is composed of a combination of light waveguides having different mode field diameters, or a combination of light waveguides that are joined to each other in a state in which centers of the mode field diameters of the respective light waveguides are displaced from each other;
    wherein a light detector for receiving scattered light scattered by the light scattering portion, is placed on a placement surface that is a surface of the monitoring light waveguide on its side opposite to that facing the semiconductor substrate, or that is the mesa facet; and
    wherein a distance from the light waveguide layer to the placement surface on which the light detector is placed, is such a distance that is larger than a mode field diameter of the light propagating through the light waveguide layer, and that does not allow an evanescent component of the light propagating through the light waveguide layer, to be caught in the light detector.

2. The semiconductor optical integrated device of claim 1, wherein the light scattering portion is a mode-field-diameter varying portion which is established due to partial variation in refractive index of the light waveguide layer.

3. The semiconductor optical integrated device of claim 1, wherein the monitoring light waveguide comprises a first light waveguide and a second light waveguide having different mode field diameters and different waveguide modes for the light, and a mode-conversion light waveguide for performing waveguide-mode conversion for the light, said mode-conversion light waveguide being connected between the first light waveguide and the second light waveguide; and
    wherein the mode-conversion light waveguide is the light scattering portion.

4. The semiconductor optical integrated device of claim 1, wherein the monitoring light waveguide comprises a first light waveguide and a second light waveguide having different mode field diameters; and
    wherein the light scattering portion is a butt joint portion where the first light waveguide and the second light waveguide are joined to each other through a butt joint in a state in which centers of the mode field diameters of the respective light waveguides are displaced from or coincide with each other.

5. The semiconductor optical integrated device of claim 1, wherein the monitoring light waveguide comprises a first light waveguide and a second light waveguide having same mode field diameters; and
    wherein the light scattering portion is a butt joint portion where the first light waveguide and the second light waveguide are joined to each other through a butt joint in a state in which centers of the mode field diameters of the respective light waveguides are displaced from each other.

6. A semiconductor optical integrated device in which a first optical element, a monitoring light waveguide and a second optical element, through which light propagates, are formed on a common semiconductor substrate;
    wherein the monitoring light waveguide is joined to the first optical element, and the second optical element is joined to the monitoring light waveguide;
    wherein the monitoring light waveguide comprises a layered body which is formed on the semiconductor substrate and in which a first cladding layer, a light waveguide layer having a light scattering portion for scattering a part of the light, and a second cladding layer, are successively stacked;

wherein the layered body has:
a high-mesa structure provided with a pair of mesa facets which are opposite to each other in an X-direction perpendicular both to a Y-direction that is perpendicular to the semiconductor substrate, and to a Z-direction that is a propagating direction of the light, and on which the light waveguide layer is exposed; or
a buried structure provided with a pair of mesa facets which are opposite to each other in the X-direction perpendicular both to the Y-direction that is perpendicular to the semiconductor substrate, and to the Z-direction that is the propagating direction of the light, and on which the light waveguide layer is not exposed;
wherein the light scattering portion is a bent portion formed in the light waveguide layer;
wherein a light detector for receiving scattered light scattered by the light scattering portion, is placed on a placement surface that is a surface of the monitoring light waveguide on its side opposite to that facing the semiconductor substrate; and
wherein a distance from the light waveguide layer to the placement surface on which the light detector is placed, is such a distance that is larger than a mode field diameter of the light propagating through the light waveguide layer, and that does not allow an evanescent component of the light propagating through the light waveguide layer, to be caught in the light detector.

7. A semiconductor optical integrated device in which a first optical element, a monitoring light waveguide and a second optical element, through which light propagates, are formed on a common semiconductor substrate;
wherein the monitoring light waveguide is joined to the first optical element, and the second optical element is joined to the monitoring light waveguide;
wherein the monitoring light waveguide comprises a layered body which is formed on the semiconductor substrate and in which a first cladding layer, a light waveguide layer and a second cladding layer are successively stacked;
wherein the layered body has a buried structure provided with a pair of mesa facets which are opposite to each other in an X-direction perpendicular both to a Y-direction that is perpendicular to the semiconductor substrate, and to a Z-direction that is a propagating direction of the light, and on which the light waveguide layer is not exposed;
wherein the monitoring light waveguide has, on at least one of the mesa facets across the X-direction, a concave portion in which a tail of a distribution of the light is caught;
wherein the concave portion serves as a light scattering portion for scattering a part of the light;
wherein a light detector for receiving scattered light scattered by the light scattering portion, is placed on a placement surface that is a surface of the monitoring light waveguide on its side opposite to that facing the semiconductor substrate, or that is one of the mesa facets, provided that it does not have said concave portion; and
wherein a distance from the light waveguide layer to the placement surface on which the light detector is placed, is such a distance that is larger than a mode field diameter of the light propagating through the light waveguide layer, and that does not allow an evanescent component of the light propagating through the light waveguide layer, to be caught in the light detector.

8. The semiconductor optical integrated device of claim 1, wherein, on the mesa facet across X-direction in the buried structure, the monitoring light waveguide has a concave-convex portion for causing the scattered light that has reached said mesa facet, to be reflected off or to transmit through that portion, in multiple directions.

9. The semiconductor optical integrated device of claim 1, wherein the light detector is formed monolithically on a surface of the monitoring light waveguide on its side opposite to that facing the semiconductor substrate.

10. The semiconductor optical integrated device of claim 1, wherein the light detector is adhered by an adhesive agent to a surface of the monitoring light waveguide on its side opposite to that facing the semiconductor substrate.

11. The semiconductor optical integrated device of claim 1, wherein the light detector is adhered by an adhesive agent to at least one of the mesa facets across the X-direction in the high-mesa structure or the buried structure.

12. The semiconductor optical integrated device of claim 7, wherein the light detector is adhered by an adhesive agent to at least one of the mesa facets across the X-direction in the buried structure.

13. The semiconductor optical integrated device of claim 9, wherein the light detector is placed at a location where it is displaced in a propagating direction of the light relative to the light scattering portion, and in which a light intensity of the scattered light scattered by the light scattering portion is highest.

14. The semiconductor optical integrated device of claim 1, wherein the monitoring light waveguide has absorption layers for absorbing the scattered light scattered by the light scattering portion, one of which is provided on a surface of the monitoring light waveguide on its side facing the semiconductor substrate, and the other of which is provided on a surface thereof on its side opposite to that facing the semiconductor substrate and at a downstream side of the light detector in a propagating direction of the light.

15. The semiconductor optical integrated device of claim 2, wherein, on the mesa facet across X-direction in the buried structure, the monitoring light waveguide has a concave-convex portion for causing the scattered light that has reached said mesa facet, to be reflected off or to transmit through that portion, in multiple directions.

16. The semiconductor optical integrated device of claim 3, wherein, on the mesa facet across X-direction in the buried structure, the monitoring light waveguide has a concave-convex portion for causing the scattered light that has reached said mesa facet, to be reflected off or to transmit through that portion, in multiple directions.

17. The semiconductor optical integrated device of claim 4, wherein, on the mesa facet across X-direction in the buried structure, the monitoring light waveguide has a concave-convex portion for causing the scattered light that has reached said mesa facet, to be reflected off or to transmit through that portion, in multiple directions.

18. The semiconductor optical integrated device of claim 5, wherein, on the mesa facet across X-direction in the buried structure, the monitoring light waveguide has a concave-convex portion for causing the scattered light that has reached said mesa facet, to be reflected off or to transmit through that portion, in multiple directions.

19. The semiconductor optical integrated device of claim 6, wherein, on the mesa facet across X-direction in the buried structure, the monitoring light waveguide has a concave-convex portion for causing the scattered light that has reached said mesa facet, to be reflected off or to transmit through that portion, in multiple directions.

20. The semiconductor optical integrated device of claim 7, wherein, on the mesa facet across X-direction in the buried structure, the monitoring light waveguide has a concave-convex portion for causing the scattered light that has reached said mesa facet, to be reflected off or to transmit through that portion, in multiple directions.

\* \* \* \* \*